(12) United States Patent
Fahlenkamp et al.

(10) Patent No.: US 9,069,020 B2
(45) Date of Patent: Jun. 30, 2015

(54) METHOD AND A CIRCUIT ARRANGEMENT FOR DETERMINING A DEMAGNETIZATION ZERO CURRENT TIME

(71) Applicant: Infineon Technologies AG, Neubiberg (DE)

(72) Inventors: Marc Fahlenkamp, Geretsried (DE); Ordwin Haase, Taufkirchen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 198 days.

(21) Appl. No.: 13/658,875

(22) Filed: Oct. 24, 2012

(65) Prior Publication Data

US 2014/0112028 A1    Apr. 24, 2014

(51) Int. Cl.
*H02M 3/335* (2006.01)
*G01R 22/06* (2006.01)

(52) U.S. Cl.
CPC ........... *G01R 22/06* (2013.01); *H02M 3/33523* (2013.01); *H02M 3/33576* (2013.01)

(58) Field of Classification Search
CPC ............ H02M 3/33523; H02M 3/335; H02M 3/33507; G01R 22/06
USPC ...................... 323/21.01, 21.06, 21.12–21.18
See application file for complete search history.

(56) References Cited

U.S. PATENT DOCUMENTS

| | | | |
|---|---|---|---|
| 6,198,638 B1 | 3/2001 | Lee | |
| 7,012,819 B2 * | 3/2006 | Feldtkeller | 363/21.01 |
| 7,791,913 B1 | 9/2010 | Su | |
| 7,800,923 B2 * | 9/2010 | Yang | 363/21.06 |
| 8,611,109 B2 | 12/2013 | Roessler et al. | |
| 2004/0240243 A1 | 12/2004 | Meyer et al. | |
| 2006/0215424 A1 | 9/2006 | Aso et al. | |
| 2007/0103946 A1 | 5/2007 | Kyono | |
| 2008/0137379 A1 | 6/2008 | Mao | |
| 2010/0027298 A1 | 2/2010 | Cohen | |
| 2010/0182808 A1 | 7/2010 | Sato et al. | |
| 2012/0250366 A1 | 10/2012 | Wang et al. | |
| 2013/0272036 A1 | 10/2013 | Fang | |

FOREIGN PATENT DOCUMENTS

DE    102011083884 A1    4/2012
EP        1499004 A1    1/2005

OTHER PUBLICATIONS

Fairchild Semiconductor, "AN6203 Applying SG6203 to Control a Synchronous Rectifier of a Flyback Power Supply", www.fairchildsemi.com, Jan. 17, 2008, pp. 1-8.

Fairchild Semiconductor, "FAN6204 Synchronous Rectification Controller for Flyback and Forward Freewheeling Rectification", www.fairchildsemi.com, Nov. 2010, pp. 1-14.

(Continued)

*Primary Examiner* — Adolf Berhane
*Assistant Examiner* — Yemane Mehari

(57) ABSTRACT

In various embodiments a method for determining a demagnetization zero current time, at which a transformer is substantially demagnetized, for a switched mode power supply comprising a transformer is provided, wherein the method may include: applying a first current through a winding of one side of the transformer; interrupting the current flow of the first current; measuring a time at which a voltage across a winding of another side of the transformer becomes substantially zero; and determining the demagnetization zero current time using the measured time.

25 Claims, 9 Drawing Sheets

(56) References Cited

OTHER PUBLICATIONS

Linear Technology Corporation "LG3825 Isolated No-Opto Synchronous Flyback Controller with Wide Input Supply Range", 2007, pp. 1-32.
Infineon Technologies AG "ICE2HS01G High Performance Resonant Mode Controller", Datasheet, Version 2.1, May 24, 2011, pp. 1-29.
Office Action received for U.S. Appl. No. 13/658,859, dated Aug. 18, 2014, 17 pages.
Office Action in the related German application No. 102013111675.2 issued on Sep. 17, 2014, 10 pages (for information purpose only).
Office Action in the corresponding German application No. 102013111348.6 issued on Sep. 19, 2014, 8 pages (for information purpose only).

* cited by examiner

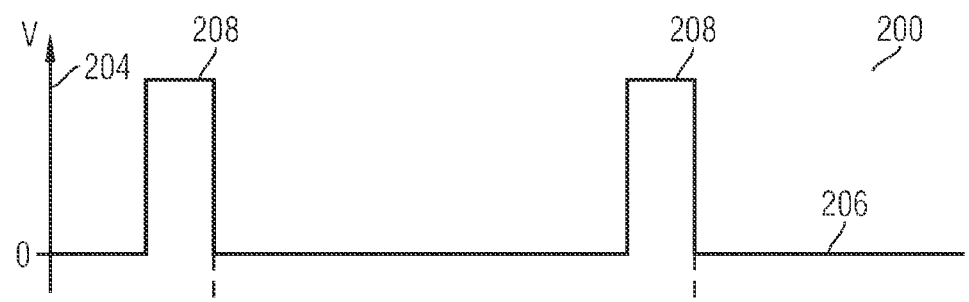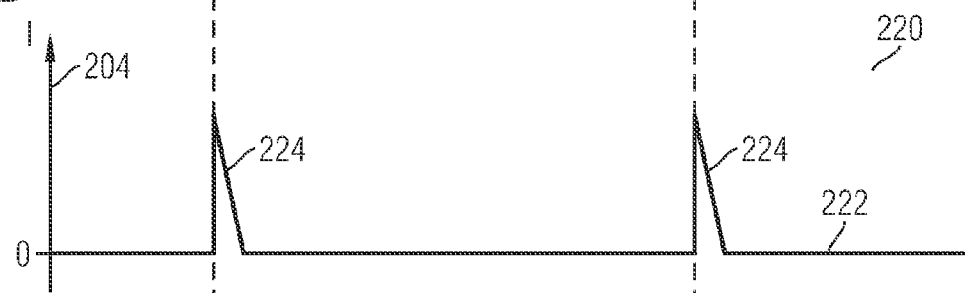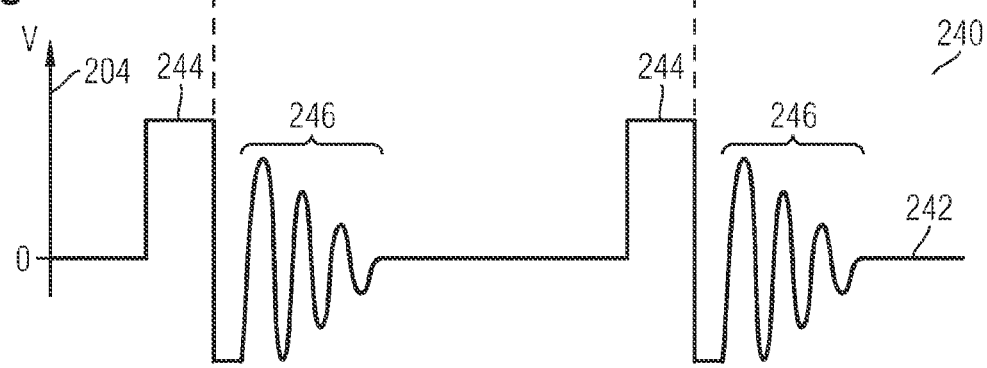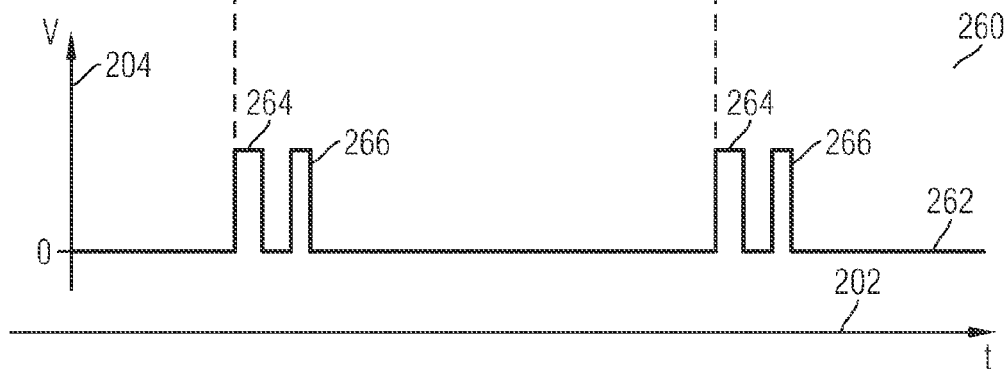

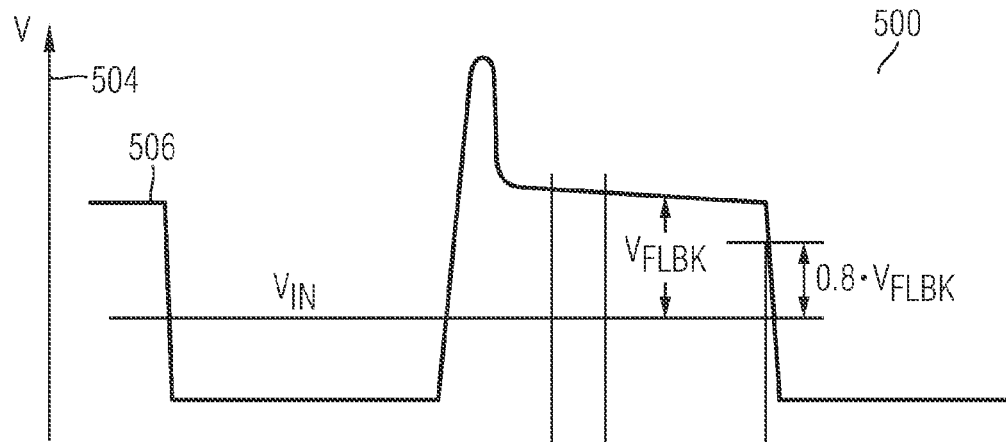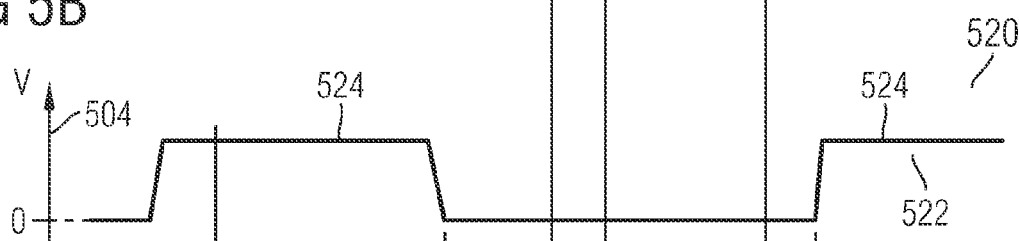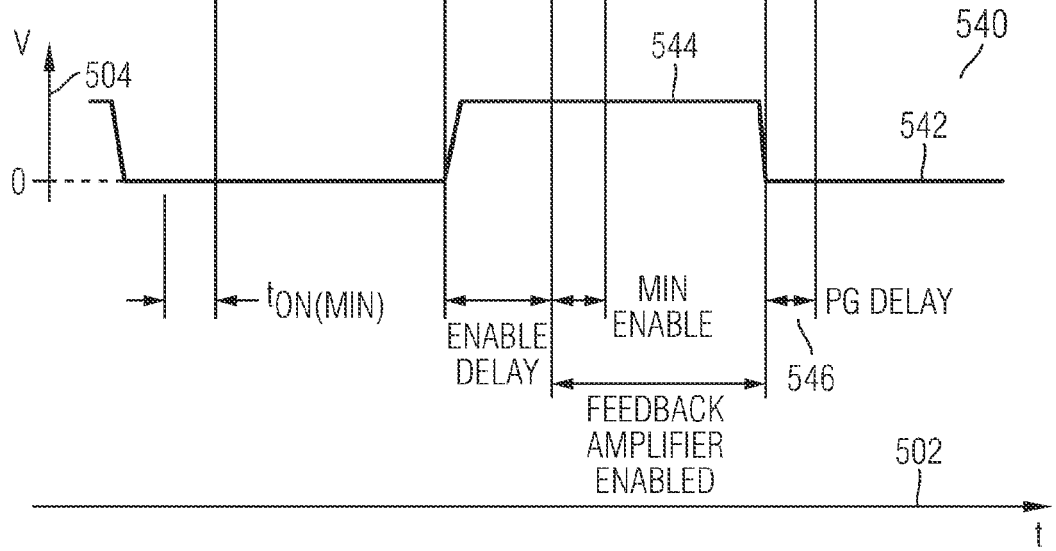

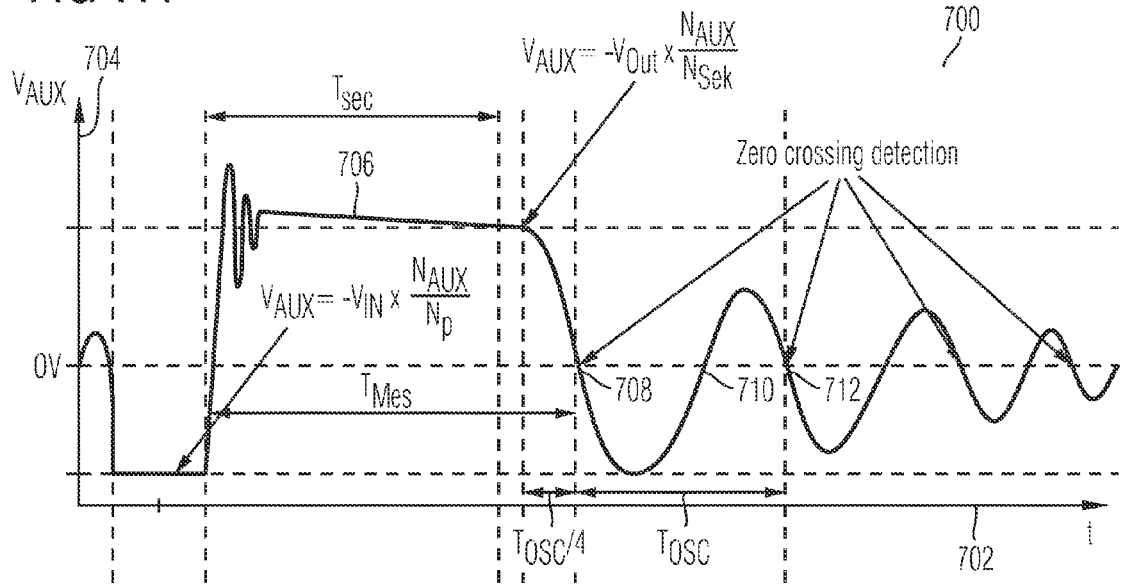
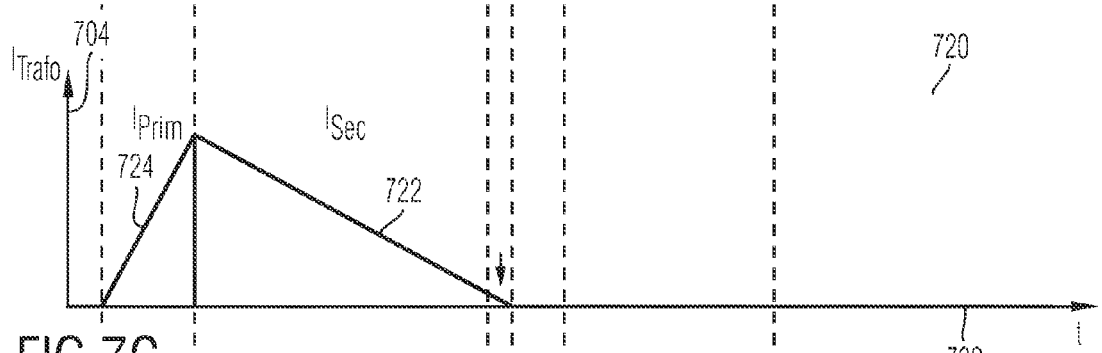
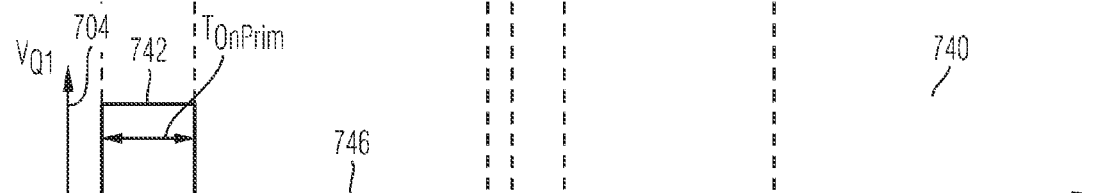
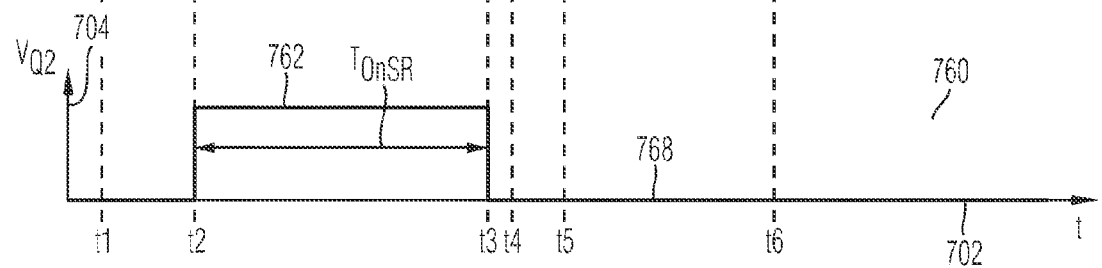

METHOD AND A CIRCUIT ARRANGEMENT FOR DETERMINING A DEMAGNETIZATION ZERO CURRENT TIME

TECHNICAL FIELD

The present invention relates generally to a method and a circuit arrangement for determining a demagnetization zero current time.

BACKGROUND

Flyback converter topologies which include a transformer providing galvanic isolation between the input and the output of the converter are commonly used in switched-mode power supplies (SMPS) of both AC/DC and DC/DC kind. Flyback topologies offer a good ratio of system costs to device performance over a wide output power range from 1 W to 100 W and more. However, when a transition to higher power classes is made, a limitation of the maximal efficiency to be achieved becomes more significant in comparison to other topologies and corresponding driving methods of switched mode power supplies. There are multiple parts in a flyback type appliance which affect the overall efficiency of the appliance in a limiting manner due to their respective power losses.

The voltage conversion in SMPS based on flyback topologies is based on an operating scheme basically involving two steps. In a first step, a power switch provided in the circuit including a primary side of the transformer is closed and energy provided at an input of the converter is stored in the magnetic field of the transformer. In a second step, the power switch on the primary side of the transformer is opened and a power switch on the secondary side of the transformer is closed, whereby the energy stored in the magnetic field of the transformer drives a demagnetization current through a secondary side of the transformer until the transformer is demagnetized. The demagnetization current flows through a rectifying diode in the circuit including the secondary side of the transformer and charges an output capacitor which is configured to provide an output voltage.

During the conduction phase of the demagnetization current through the rectifying diode, the diode forward voltage drop is responsible for a power loss. The demagnetization currents rise drastically for higher powers and in appliances with small output voltages and therefore the corresponding power loss in the rectifying diode also increases.

The problem of the power loss in a diode inherent in its forward voltage drop can be tackled in various ways. One possible approach is the synchronous rectification scheme, according to which, on the secondary side of the transformer, the function of the rectifying diode in conducting state is replaced by a power switch which is switched in predefined time intervals and is driven in sync with the power switch on the primary side of the converter. The power switch on the secondary side of the transformer can avoid the forward voltage drop of the rectifying diode in conducting operation and the power loss connected therewith.

SUMMARY

In various embodiments a method for determining a demagnetization zero current time, at which a transformer is substantially demagnetized, for a switched mode power supply comprising a transformer is provided, wherein the method may include: applying a first current through a winding of one side of the transformer; interrupting the current flow of the first current; measuring a time at which a voltage across a winding of another side of the transformer becomes substantially zero; and determining the demagnetization zero current time using the measured time.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 2A to 2D show various signal sequences during the operation of the conventional flyback power converter shown in FIG. 1A or FIG. 1B;

FIGS. 5A to 5C show various signal sequences which are output by the controller of the conventional flyback power converter circuit shown in FIG. 4;

FIGS. 7A to 7D show various signal sequences in the form of voltages and currents during the operation of the switched mode power supply circuit according to various embodiments shown in FIG. 6.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

A flyback (power) converter usually includes a transformer which provides galvanic isolation between the input(s) and the output(s) of the converter. A flyback converter circuit may include two main sides or circuits. In the following, the terms "primary side", "primary circuit" and "primary circuit side" may refer to the side or part of the flyback converter circuit which is connected to or includes the input(s) of the flyback converter and is therefore galvanically separated from the side or part of the flyback converter circuit which is connected or includes the output(s) of the flyback converter circuit. In analogy, the term "secondary side", "secondary circuit" and "secondary circuit side" may refer to the side or part of the flyback converter circuit which is connected to or includes the output(s) of the flyback converter and is therefore galvanically separated from the side or part of the flyback converter circuit which is connected or includes the input(s) of the flyback converter circuit.

In general, controlling of the power switch on the secondary side of the converter may be executed directly from the secondary side of the converter or from the primary side of the converter, as shall be briefly outlined in the following on the basis of architectures already known.

Figure 1A:
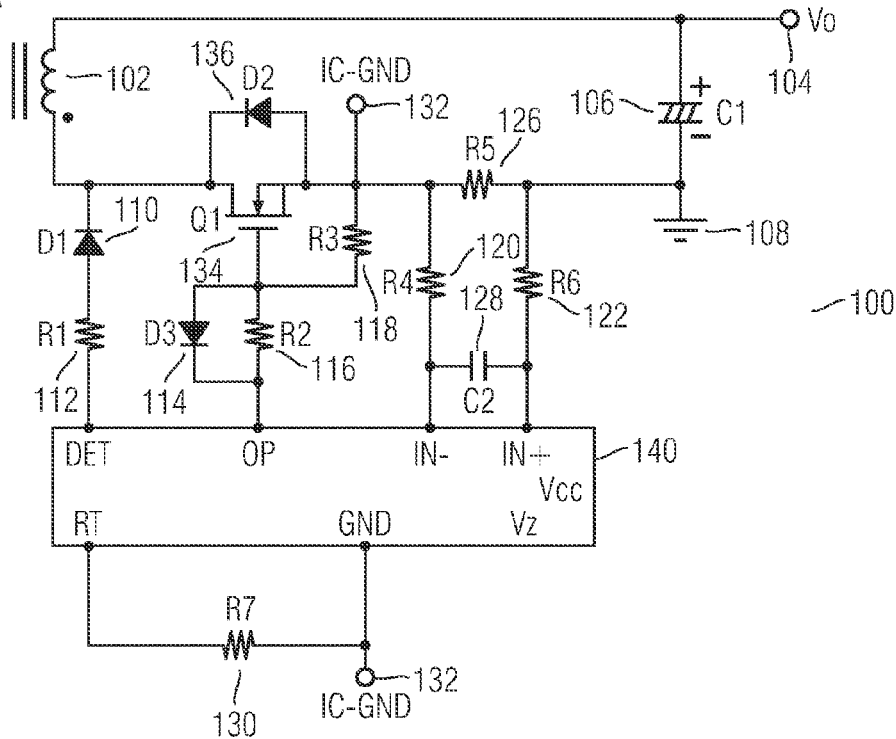
FIG. 1A shows a secondary side circuit of a conventional flyback power converter.

In FIG. 1A a secondary side circuit 100 of a flyback power converter is shown. The secondary side circuit 100 of a flyback power converter includes a secondary winding 102 which is magnetically coupled to a primary winding (not shown in the figure) and together with the primary winding forms a transformer of the flyback power converter. One end of the secondary winding 102 is connected to an output terminal 104 of the secondary side circuit 100 to which an external load can be connected. One side of a first capacitor 106 is connected to the electrical path between the output terminal 104 and the secondary winding 102, the other side of the first capacitor 106 is connected to a reference potential 108, for example the ground potential. The other end of the secondary winding 102 is connected to a drain of a MOSFET (metal-oxide-semiconductor field effect transistor) transistor 134 and to a terminal DET of a secondary side synchronous rectification controller 140 (hereinafter referred to as the controller 140) via a series arrangement of a first diode 110 and a first resistor 112. The gate of the MOSFET transistor 134 is connected to a terminal OP of the controller 140 via a second resistor 116, wherein a second diode is coupled in parallel to the second resistor 116 between the gate of the MOSFET transistor 134 and the terminal OP of the controller 140. The gate of the transistor 134 is coupled to a source of the same via a third resistor 118 and to a terminal IN− of the controller 140 via a fourth resistor 120. The source of the transistor 134 is further connected to the drain of the same via a second diode 136, to the reference potential 108 via a fifth resistor 126 and to a terminal IN+ of the controller 140 via a the fifth resistor 126 and a sixth resistor 122. A node to which the source of the MOSFET transistor and the third resistor 118 are connected is coupled to an integrated circuit ground potential 132. A second capacitor 128 is coupled between the IN− terminal and the IN+ terminal of the controller 140. A terminal RT of the controller 140 is coupled to an integrated circuit ground potential 132 via a seventh resistor 130, a terminal GND of the controller 140 is directly coupled to the integrated circuit ground potential 132.

The secondary side circuit 100 of a flyback power converter shown in FIG. 1A includes the controller 140 which controls the switching times of the MOSFET transistor 134. The fifth resistor 126 is used as a current sensing resistor via which the controller 140 is able to sense a demagnetization current flowing through the secondary winding 102 of the transformer when the power switch on the primary side (not shown in FIG. 1A) of the flyback power converter is opened and the MOSFET transistor 134 is closed. The MOSFET transistor 134 acts as a power switch on the secondary side of the flyback power converter and provides synchronous rectification functionality. Once the demagnetization current flowing through the secondary winding 102 falls below zero, i.e. when a zero current crossing occurs, the voltage sensed at the terminal IN+ is lower than the voltage sensed at the terminal IN− of the controller 140. The detection of such an event triggers a signal by which the transistor 134 is turned off to prevent a further current flow through the secondary side circuit 100 which may discharge the first capacitor 106 in reverse direction, e.g. in a direction opposed to its inherent polarity. The fourth resistor 120 and the sixth resistor 122 can be used to set the current level at which the MOSFET transistor 134 is turned off. The state of the power switch provided in the primary side circuit (not shown in FIG. 1A) of the flyback power supply is sensed via the terminal DET of the controller 140, which is connected to the secondary winding 102 of the transformer via the first diode 110 and the first resistor 112. Once the power switch on the primary side circuit is turned on, a current flow through the primary winding of the transformer induces a voltage in the secondary winding 102 of the transformer such that a high voltage is sensed at the terminal DET of the controller 140. Such an event marks the beginning of a new switching cycle.

Figure 1B:
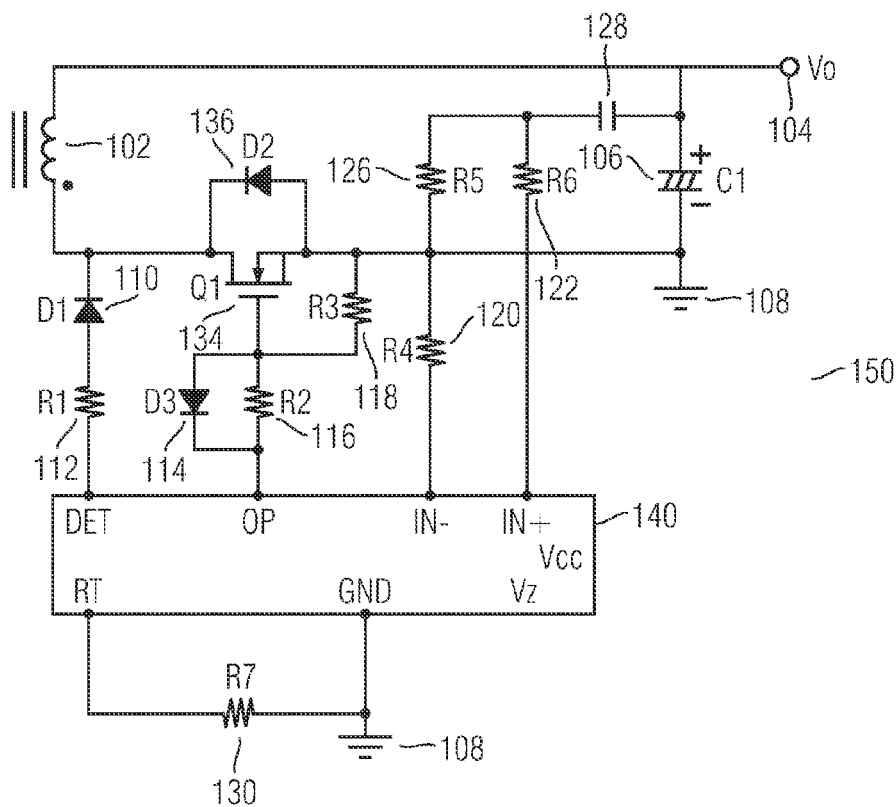
FIG. 1B shows a further secondary side circuit of a conventional flyback power converter.

A slightly altered current sensing method is explained on the basis of a secondary side circuit 150 of a flyback power converter shown in FIG. 1B. The secondary side circuit 150 is similar to the secondary side circuit 100 shown in FIG. 1A. Therefore the same elements or elements having the same functionality and arrangement within the will be labelled with the same reference numbers and for the sake of brevity will not be described again. In the secondary side circuit 150 of FIG. 1B the fifth resistor 126, the sixth resistor 122 and the second capacitor 128 have been relocated from the position as shown in the secondary side circuit 100 of FIG. 1A. The second capacitor 128, instead of being coupled between the terminal IN− and the terminal IN+ of the controller 140, is coupled to the electrical path between the first capacitor 106 and the output 104 of the secondary side circuit 150 with its one side, the other side thereof is coupled to the terminal IN+ of the controller 140 via the sixth resistor 122, to the source of the MOSFET transistor 134 via the fifth resistor 126 and to the terminal IN− of the controller 140 via the fifth resistor 126 and the fourth resistor 120. This altered configuration provides a high pass filter including the fifth resistor 126 and the second capacitor 128 to sense via the fifth resistor 126 the demagnetization current flowing through the secondary winding 102 of the transformer.

In order to drive the power switch in the form of the MOSFET transistor 134 to provide synchronous rectification, the controller 140 arranged on the secondary side circuit of a flyback power converter as shown in FIG. 1A or in FIG. 1B requires an additional PWM (pulse with modulation) circuit, which increases the system costs. Furthermore, due to the synchronization signal of the primary switch arranged on the primary side circuit (not shown in FIG. 1A and FIG. 1B) of the converter is sensed via the secondary winding 102 of the transformer, situations might occur in which the MOSFET transistor 134 is switched on at a false point in time. The origin of a faulty trigger signal will be explained on the basis of the diagrams shown in FIGS. 2A, 2B, 2C and 2D. All diagrams share a common x-axis 202 which denotes time. The y-axis 204 denotes an amplitude of a signal shown in the respective diagram. In diagram 200, a driving signal 206 for the power switch provided in the primary side circuit of the flyback power converter of FIG. 1A and FIG. 1B is shown. An interval during which the driving signal 206 is at a high level denotes a time interval in which the power switch in the primary side circuit is turned on. In diagram 200 two pulses 208 are present during which the power switch in the primary side circuit remains closed. Diagram 220 shows the course of the demagnetization current 222 on the secondary circuit side of the flyback power converter shown in FIG. 1A and FIG. 1B. Whenever the driver signal 206 returns to its low value, i.e. whenever the power switch provided in the primary side circuit is opened, the demagnetization current 222 through the secondary winding 102 of the transformer spikes and starts to decrease linearly immediately thereafter to its zero value. Such an event can be observed to occur twice in diagram 220 in the form of two pulses 224 having a triangular shape. In diagram 240, a potential 242 which is sensed at the terminal DET of the controller 140 is displayed. During the time the driving signal 206 is at its high value (i.e. for the duration of the pulses 208 in diagram 200), a positive potential pulse 244 is sensed at the terminal DET of the controller 140. During this time there is no current flow through the secondary winding 102. When the driving signal 206 returns to its low value, i.e. when the power switch provided in the primary side circuit of the flyback power converter is turned off, the demagnetization current 222 flowing through the secondary winding 102 reverses the polarity of the voltage which is sensed at the terminal DET of the controller 140. The transition of the voltage 242 from a high value to a low value sensed at the terminal DET of the controller 140 triggers a driving signal pulse 264 on the driving signal 262 for MOSFET transistor 134 as shown in diagram 260. When the transformer is demagnetized, the demagnetization current 222 drops to its zero value. However, due to ringing 246 present on the windings of the transformer and therefore also detected at the terminal DET of the controller 140, a false driving signal pulse 266 for the MOSFET transistor 134 may be triggered. This undesirable situation may be prevented by providing an RC filter in the electrical path connecting the DET terminal of the controller 140 with the primary winding 102 in the form of an additional filter capacitor connected between the DET terminal of the controller 140 and the first resistor 112 with its one side, and to the reference potential with its other side.

Figure 3:
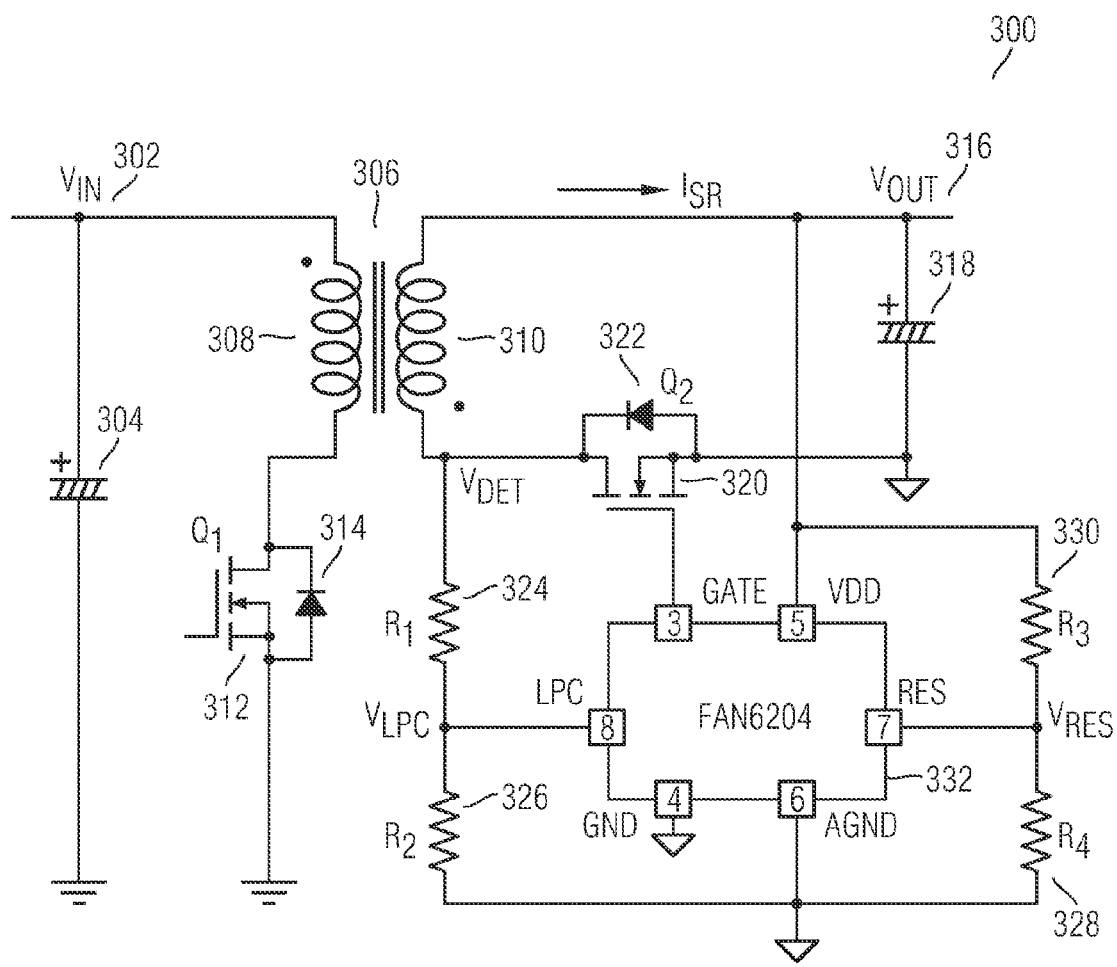
FIG. 3 shows a conventional flyback power converter circuit.

In FIG. 3 a flyback power converter circuit 300 is shown which also includes a synchronous rectification controller 332 (will be referred to as the controller 332 in the following) arranged on the secondary side of the flyback power converter circuit 300. The controller 332 makes use of a linear timing predict method to determine the turn-on time of a second power switch 320 provided in the secondary side circuit of the flyback power converter circuit 300 by measuring the turn-on time of a first power switch 312 provided in the primary side circuit of the flyback power converter circuit 300 and the amplitude of input voltage. The underlying principle for the linear timing predict method used in the controller 332 is the volt-second balance theorem.

The flyback power supply converter circuit 300 shown in FIG. 3 includes an input terminal 302 which is connected to one end of a primary winding 308 of a transformer 306, wherein a first capacitor 304 is coupled between the electrical path between the input 302 and the one end of the primary winding 308 and a reference potential, for example the ground potential. The other end of the primary winding 308 is connected to a drain of the first transistor 312, a source of the same is coupled to the reference potential. A first diode 314 is coupled in parallel to the first transistor 312 between its source and drain. The elements described so far form the primary side circuit of the flyback power converter circuit 300 shown in FIG. 3. The elements forming the secondary side circuit of the flyback power converter circuit 300 will be described in the following.

The primary winding 308 of the transformer 306 is magnetically coupled to a secondary winding 310 of the transformer 306. One end of the secondary winding 310 is coupled to an output terminal 316 and to a terminal VDD of the controller 332. That same end of the secondary winding 310 is also coupled to a reference potential via a series arrangement of a third resistor 330 and a fourth resistor 328. The electrical path between the third resistor 330 and the fourth resistor 328 is coupled to a terminal RES of the controller 332. The other end of the secondary winding 310 is coupled to a drain of the second transistor 320 which provides the functionality of synchronous rectification and to the reference potential via a series arrangement of a first resistor 324 and a second resistor 326. The electrical path between the first resistor 324 and the second resistor 326 is coupled to an LPC terminal of the controller 322. The gate of the second transistor 320 is coupled to a terminal GATE of the controller 332. A GND terminal and an AGND terminal of the controller 332 are coupled to the reference potential. A second diode 322 is coupled in parallel to the second transistor 320 between its drain and source. One side of a second capacitor 318 is coupled to the output terminal 316, the other side of the second capacitor 318 is coupled to the reference potential and the source of the second transistor 320.

The controller 332 uses the terminal LPC and the voltage divider including the first resistor 324 and the second resistor 326 to sense the voltage across the secondary winding 310 of the transformer 306. The terminal RES and the voltage divider including the third resistor 330 and the fourth resistor 328 are used to sense the output voltage provided at the output terminal 316. Using those voltages and the on-time of the first transistor 312 the controller 332 is able to determine the on-time of the second transistor 320 on the basis of the volt-second balance theorem which will be explained later in more details.

Since the flyback power converter circuit 300 shown in FIG. 3 makes use of the volt-second balance theorem in order to determine the turn-on time of the second transistor 322, issues with false triggers due to ringing which maybe present on the transformer windings as explained in the case of the flyback power converters shown in FIG. 1A and FIG. 1B may be avoided. However, with the necessity of an additional PWM circuit (in addition to a PWM circuit in the primary side circuit for driving the first transistor 312) which is included in the controller 332 in the secondary side circuit of the flyback power supply circuit 300 for driving the second transistor 320, the problem of increased system costs remains.

Figure 4:
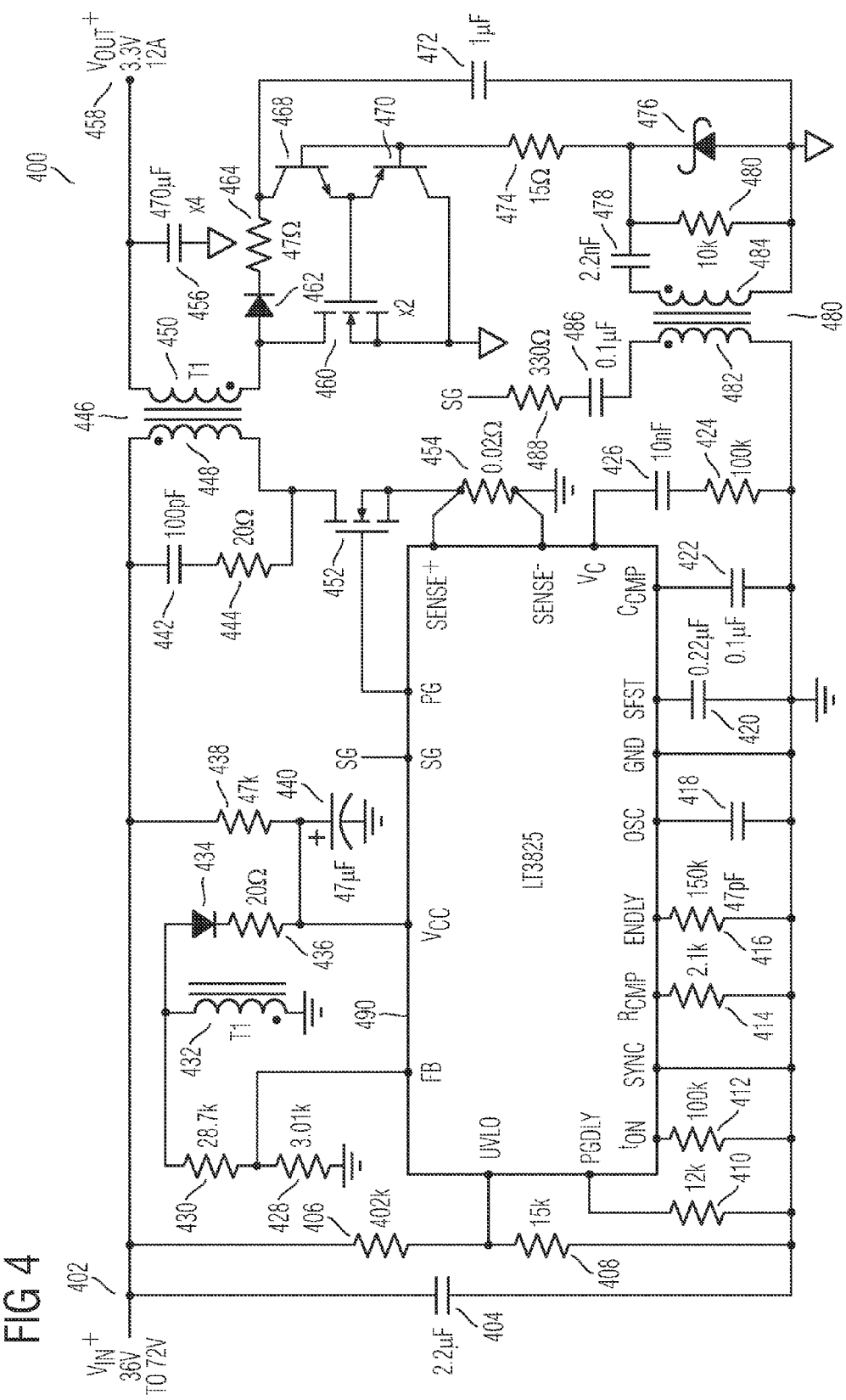
FIG. 4 shows a further conventional flyback power converter circuit.

In FIG. 4 a flyback power converter circuit 400 is shown which includes a controller 490 for driving a first power switch 452 and a second power switch 460, the latter providing synchronous rectification functionality. In contrast to the concepts of flyback power converters shown in FIGS. 1A and 1B or FIG. 3, the controller 490 is provided on the primary circuit side of the converter circuit 400 as shown in FIG. 4. The converter circuit 400 includes an input terminal 402 which is connected to one end of a primary winding 448 of a first transformer 446. The input terminal 402 is further connected to a reference potential, for example the ground potential, via a first capacitor 404 and to a terminal UVLO of the controller 490 via a sixth resistor 406, wherein the terminal UVLO of the controller 490 is connected to the reference potential via a fifth resistor 408. The input terminal 402 is connected to the reference potential via a series arrangement comprising a fourth resistor 438 and a third capacitor 440, wherein the electrical path between the fourth resistor 438 and the third capacitor 440 is connected to a terminal VCC of the controller 490. The terminal VCC of the controller 490 is connected to one end of an auxiliary winding 432 via a series arrangement including a third resistor 436 and a first diode 434, the other end of the auxiliary winding 432 is connected to the reference potential. The auxiliary winding 432 is magnetically coupled to the first transformer 446. A terminal FB of the controller 490 is connected to the reference potential via a second resistor 428 and to the one end of the auxiliary winding 432 via a first resistor 430. The other end of the primary winding 448 of the transformer 446 is connected to the input terminal 402 via a series arrangement including a thirteenth resistor 444 and a fourth capacitor 442 and to a drain of a first transistor 452. A gate of the first transistor 452 is connected to a terminal PG of the controller 490 and a source of the first transistor 452 is connected to the reference potential via a twelfth resistor 454. The electrical path between the source of the first transistor 452 and the twelfth resistor 454 is coupled to a terminal SENSE+ of the controller 490 and the electrical path between the reference potential and the twelfth resistor 454 is coupled to a terminal SENSE− of the controller 490. A terminal SG of the controller 490 is coupled to one end of a primary winding 482 of a second transformer 480 via a series arrangement including a fifteenth resistor 488 and an eighth capacitor 486. The other side of the primary winding 482 of the second transformer 480 is coupled to the reference potential. A terminal VC of the controller 490 is coupled to the reference potential via a series arrangement including a seventh capacitor 426 and an eleventh resistor 424. A terminal CCMP of the controller 490 is coupled to the reference potential via a sixth capacitor 422. A terminal SFST of the controller 490 is coupled to the reference potential via a fifth capacitor 420. A terminal GND of the controller 490 is coupled to the reference potential. The terminal OSC of the controller 490 is coupled to the reference potential via a second capacitor 418. A terminal ENDLY of the controller 490 is coupled to the reference potential via a tenth resistor 416. A terminal RCMP of the controller 490 is coupled to the reference potential via a ninth resistor 414. The terminal SYNC is coupled to the reference potential. A terminal $t_{ON}$ is coupled to the reference potential via an eighth resistor 412. A terminal PGDLY is coupled to the reference potential via a seventh resistor 410. The elements described so far form the primary side circuit of the converter circuit 400 shown in FIG. 4 or, in other words, are allocated on the primary side of the converter circuit 400. The rest of the elements to be described in the following in the converter circuit 400 shown in the FIG. 4 form the secondary side circuit.

The secondary side of the converter circuit 400 includes a secondary winding 450 of the first transformer 446 which is galvanically coupled to the first winding 448 of the first transformer 446 arranged on the primary circuit side. One end of the secondary winding 450 is coupled to an output terminal 458 and to one side of an eleventh capacitor 456, the other side of which is coupled to the reference potential. The other side of the secondary winding 450 is coupled to a second diode 462 and to one end of a fourteenth resistor 464. The other end of the fourteenth resistor 464 is coupled to a tenth capacitor 472 which in turn is coupled to the reference potential and to the reference potential via a series arrangement including a third transistor 468 and a fourth transistor 470. A base of the third transistor 468 and a base of the fourth transistor 470 are coupled to the reference potential via a series arrangement including a sixteenth resistor 474 and a third diode 476. The electrical path between the third transistor 468 and the fourth transistor 470 is coupled to a gate of a second transistor 460. A source of the second transistor is coupled to the reference potential, a drain of the second transistor is coupled to the other end of the secondary winding 450 of the first transformer 446. The electrical path between the sixteenth resistor 474 and the third diode 476 is coupled to one end of a secondary winding 484 of the second transformer 480 via a ninth capacitor 478 and to the reference potential via a seventeenth resistor 480. The other side of the second winding 484 of the second transformer 480 is coupled to the reference potential.

The control method implemented in the controller 490 only supports a CCM (continuous current mode) of a fixed frequency. This means, that only a fixed relation between the on-times and off-times of the power switch on the primary circuit side, i.e. the first transistor 452, and the secondary power switch, i.e. the second transistor 460, can be chosen and used. The fixed relation is independent of the load connected to the output terminal 458 of the converter circuit 400 or the input voltage supplied at the input terminal 402 of the converter circuit 400. With the architecture presented in FIG. 4 a DCM (discontinuous conduction mode) is not possible. In general, in a CCM the demagnetization current in the winding of the transformer on the secondary side circuit never goes to zero between switching cycles. In a DCM the transformer may be fully demagnetized and the demagnetization current through the winding of the transformer on the secondary side circuit may drop to zero during part of the switching cycle.

Various signal sequences which are output by the controller 490 of the converter circuit 400 shown in FIG. 4 are displayed in diagrams in FIGS. 5A to 5C. All three diagrams share a common time axis, i.e. the x-axis 502. The y-axis 504 in each of the diagrams denotes an amplitude of a respective signal. In diagram 500 of FIG. 5A the graph represents the drain voltage 506 of the first transistor 452 arranged on the primary circuit side. In diagram 520 of FIG. 5B the graph shows a first gate driver signal 522 which is output at the terminal PG of the controller 490 and provided to the gate of the first transistor 452. In diagram 540 of FIG. 5C the graph shows a second gate driver signal 542 provided at the terminal SG of the controller 490, which is transmitted to the secondary side circuit of the converter circuit 400 via the second transformer 480 and applied to the gate of the second transistor 460.

A high value of the first gate driver signal 522 and the secondary side gate driver signal 542 corresponds to an on-state of the first transistor 452 and the second transistor 460, respectively. From diagram 520 and diagram 540 it can be seen that the first transistor 452 and the second transistor are turned on and off in a mutually exclusive manner. During operation of the converter circuit 400 the controller 490 measures the current through the first winding 448 of the first converter 446 via the terminal SENSE+ and the terminal SENSE−. When the second gate driver signal 542 at the terminal SG of the controller 490 is raised to a high value and transmitted from the primary side circuit to the secondary side circuit of the converter circuit 400 via the second transformer 480, the second transistor 460 is turned on. During an on-state pulse 544 which corresponds to a high value of the second gate driver signal 542 in diagram 540 in FIG. 5C, the second transistor 460 providing synchronous rectification remains activated. Depending on whether the first transistor 452 or the second transistor 460 is activated, the drain voltage 506 of the first transistor is at a negative value or a positive value as shown in diagram 500 in FIG. 5A.

In accordance with various embodiments a method and a device are provided which may allow for a reduction of the power loss due to the use of a rectification diode provided in the secondary side circuit of the transformer in a flyback power converter circuit. In various embodiments a flyback converter circuit is provided, wherein the synchronous rectification is controlled by the primary side circuit of the converter, a concept which was already explained on the basis of the converter circuit 400 shown in FIG. 4. However, in contrast to that converter circuit 400, the controlling circuit for controlling a switched mode power supply according to various embodiments may be also operated in discontinuous current mode and in a quasi-resonant mode with variable operation frequencies, i.e. with variable frequencies of the switching cycles.

According to various embodiments, one possible method to determine the time the switch arranged in the secondary side circuit and providing synchronous rectification needs to remain switched on is to make use of the volt-second balance theorem. The commonly used rectification diode may be replaced by the switch providing synchronous rectification. A switched mode power supply using the controller for controlling the operation of the switched mode power supply according to various embodiments may have the advantage that, when compared to the switched mode power supply circuits presented in FIG. 1A, FIG. 1B and FIG. 3, only one PWM circuit may be necessary, which may be provided in the controller according to various embodiments, wherein the controller may be provided on the primary circuit side of the switched mode power supply. The flyback converters presented in FIG. 1A and FIG. 1B require a second PWM controller on the secondary circuit side which increases system costs. Furthermore, the controller and the method to control a switched mode power supply offer the possibility of an increase of the efficiency in quasi-resonant operation mode.

Figure 6:
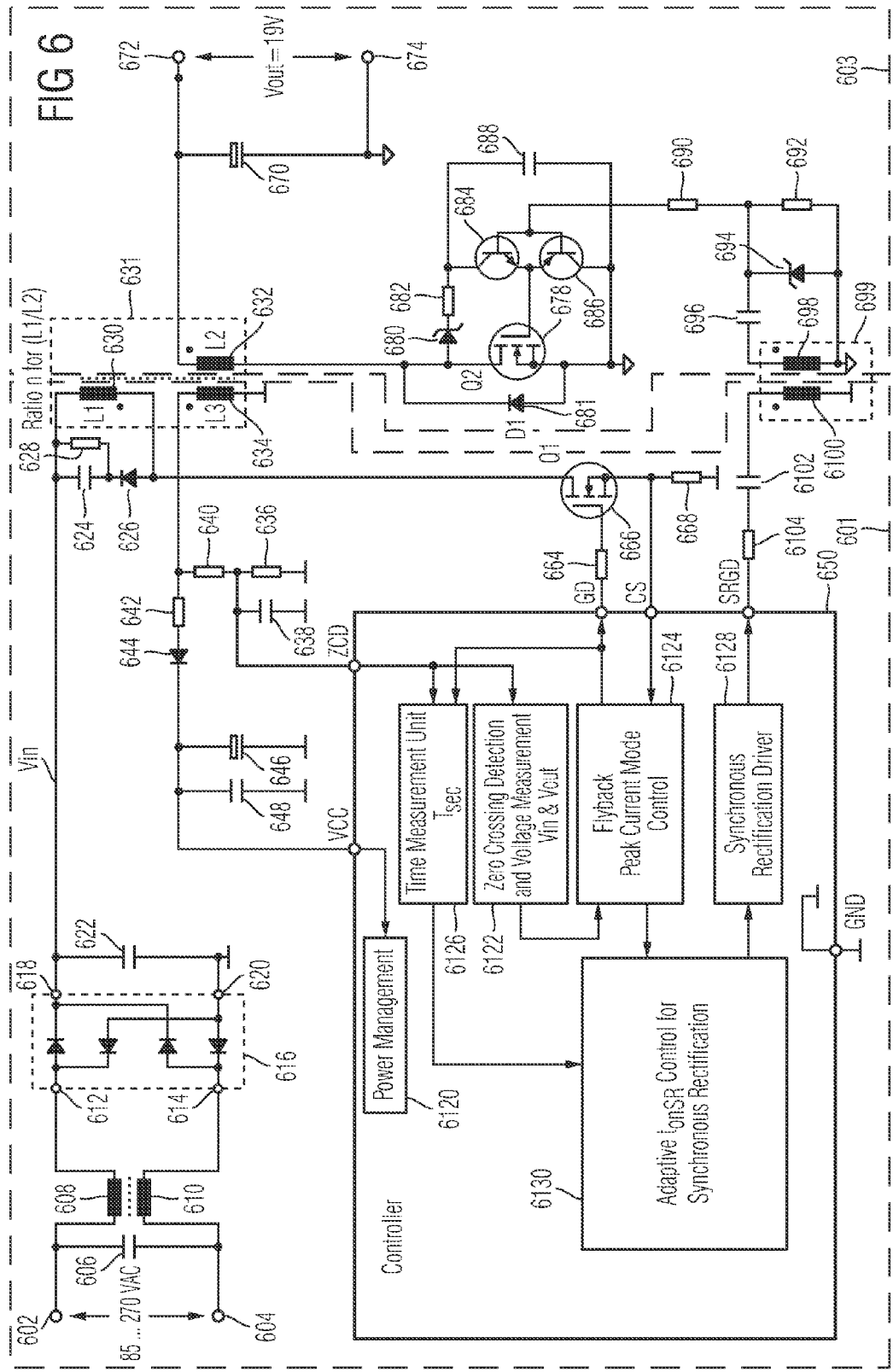
FIG. 6 shows a switched mode power supply circuit including a controller for controlling a switched mode power supply according to various embodiments

In FIG. 6 a switched mode power supply circuit (in the following also referred to as SMPS circuit) including a controller for controlling a switched mode power supply according to various embodiments is shown. The switched mode power supply circuit 600 includes a first input 602 and a second input 604, to which an input voltage may be applied, an AC input voltage in the range from 85 V to 270 V, for example. The first input 602 may be coupled to a first side of a first inductor 608 and the second input 604 may be coupled to a first side of a second inductor 610. A first capacitor 606 may be coupled in parallel between the first input 602 and the second input 604. The first inductor 608 and the second inductor 610 may be magnetically or inductively coupled to one another. For example, the inductors may be provided in the form of coils which may be connected by a core or wrapped around a core including a material with a high permeability, such as iron, mu-metal or steel, in order to provide a magnetic coupling between the two coils. A second side of the first inductor 608 may be coupled to a first input 612 of a full wave rectification circuit 616 which may be configured to provide rectification functionality by the means of four diodes. A second side of the second inductor 610 may be coupled to a second input 614 of the full wave rectification circuit 616. A first output 618 of the full wave rectification circuit 616 may be coupled to a first side of a third inductor 630 and via a second capacitor 622 to a reference potential, for example the ground potential. The side of the second capacitor 622 which is coupled to the reference potential is further coupled to a second output 620 of the full wave rectification circuit 616. The first output 618 of the full wave rectification circuit 616 may be further coupled to the reference potential via a series arrangement including a third capacitor 624, a first diode 626, a first switch 666, for example a MOSFET transistor, and a first resistor 668. A second resistor 628 may be coupled in parallel to the third capacitor 624. The other side of the third inductor 630 may be coupled to the electrical path between the first diode 626 and the first transistor 666. The third inductor 630 may be magnetically coupled to a fourth inductor 634 and to a fifth inductor 632, all three inductors being parts of a first transformer 631. The magnetic coupling may be achieved in the same way as the magnetic coupling between the first inductor 608 and the second inductor 610 described above. One side of the fourth inductor 634 may be coupled to the reference potential, the other side thereof may be coupled to a first terminal VCC of a controller 650 via a series arrangement including a third resistor 642 and a second diode 644. One side of a fourth capacitor 646 may be coupled to the electrical path between the second diode 644 and the first terminal VCC of the controller 650. A fifth capacitor 648 may be coupled in parallel to the fourth capacitor 646 to the electrical path between the second diode 644 and the terminal VCC of the controller 650. The one side of the fourth inductor 634 may be further coupled to the reference potential via a series arrangement including a fourth resistor 640 and a fifth resistor 636. The electrical path between the fourth resistor 640 and the fifth resistor 636 may be coupled to the reference potential via a sixth capacitor 638 and to a second terminal ZCD of the controller 650. A control terminal of the first transistor 666, for example a gate, may be coupled to a third terminal GD of the controller 650 via a sixth resistor 664. The electrical path between a terminal the first transistor 666, or example a source of the first transistor 666, and the first resistor 668 may be coupled to a fourth terminal CS of the controller 650. The controller 650 may further include a fifth terminal SRGD which is coupled to one side of a sixth inductor 6100 via a series arrangement including a seventh resistor 6104 and a seventh capacitor 6102. The other side of the sixth inductor 6100 may be coupled to the reference potential. The sixth inductor 6100 may be magnetically coupled to a seventh inductor 698, the two inductors forming a second transformer 699. The elements described so far may be allocated to the primary side circuit 601 of the switched mode power supply circuit 600 which is galvanically separated from the secondary side circuit 603 thereof. The controller 650 further includes a sixth terminal GND which may be coupled to the reference potential. In the following, the elements included in the secondary side circuit 603 will be described.

One end of the seventh inductor 698 may be coupled to the reference potential, the other side thereof may be coupled to a terminal of a fourth transistor 684, for example to a base thereof, and a terminal of a third transistor 668, for example to a base thereof, via a series arrangement comprising an eighth capacitor 696 and an eighth resistor 690. One terminal of a third diode 694 may be connected to the electrical path between the eighth capacitor 696 and the eighth resistor 690, the other terminal thereof may be coupled to the reference potential. A ninth resistor 692 may be coupled in parallel to the third diode 694 to the electrical path between the eighth resistor 690 and the eighth capacitor 696. A second terminal of the fourth transistor 684, for example a collector of a pnp BJT (bipolar junction transistor), may be coupled to one side of the fifth inductor 632 via a series arrangement comprising a ninth resistor 682 and a fourth diode 680. A third terminal of the fourth transistor 684, for example an emitter of a pnp BJT, may be coupled to second terminal of the third transistor 686, for example an emitter of an npn BJT. A third terminal of the third transistor 686, for example a collector of an npn BJT, may be coupled the electrical path between the ninth resistor 682 and the second terminal of the fourth transistor 684 via a ninth capacitor 688. The second terminal of the third transistor 686 may be also coupled to a terminal of a second switch 678, for example a source/drain terminal of a MOSFET transistor, which may be coupled to the reference potential. The other terminal of the second transistor 678, for example the other source/drain terminal thereof, may be coupled to the electrical path between the fourth diode 680 and the fifth inductor 632. A control terminal of the second transistor 678, for example a gate, may be coupled to the electrical path between the third terminal of the fourth transistor 684 and the second terminal of the third transistor 686. A fifth diode 681 may be coupled in parallel to the second transistor, i.e. with its one terminal to one source/drain terminal of the second transistor 678 and with its other terminal to the other source/drain terminal of the second transistor 678. The other end of the fifth inductor 632 is coupled to a first output 672 of the switched mode power supply circuit 600. One side of a tenth capacitor 670 may be coupled to the electrical path between the first output 672 and the fifth inductor 632, the other end thereof may be coupled to a second output terminal 674 of the switched mode power supply circuit 600 and to the reference potential.

In the following, the functional structure within the controller 650 according to various embodiments will be described.

The controller 650 may include a power management circuit 6120 which may be connected to the first terminal VCC of the controller 650. The second terminal ZCD of the controller 650 may be connected to an input of a zero crossing detection and voltage measurement circuit 6122 and to a first input of a time measurement circuit 6126. An output of the zero crossing detection and voltage measurement circuit 6122 may be coupled to a first input of a flyback peak current mode control circuit 6124. A first output of the flyback peak current mode control circuit 6124 may be coupled to the third terminal GD of the controller 650 and to a second input of the time measurement circuit 6126. A second output of the flyback peak current mode control circuit 6124 may be coupled to a first input of an adaptive synchronous rectification control circuit 6130. A second input of the flyback peak current mode control circuit 6124 may be coupled to the fourth terminal CS of the controller 650. An output of the time measurement circuit 6126 may be connected to a second input of the adaptive synchronous rectification control circuit 6130. An output of the adaptive synchronous rectification control circuit 6130 may be coupled to an input of a synchronous rectification driver circuit 6128, an output of which may be connected to the fifth terminal SRGD of the controller 650. A sixth terminal GND of the controller 650 may be connected to the reference potential, for example the ground potential.

In the following the functionality of the switched mode power supply circuit 600 will be explained. An input voltage of AC or DC type in the range from approximately 85 V to approximately 270 V may be provided between the first input 602 and the second input 604 of the circuit 600 and applied to the third inductor 630. By driving the first switch 666 provided in the primary side circuit 601 in an appropriate manner, for example by applying a driving signal from the third terminal GD of the controller 650 including a PWM signal to the control terminal of the switch, the first switch 666 may be closed or opened. Thereby, a current may flow through the winding of the third inductor 630 and energy may be stored in the resulting magnetic field within the first transformer 631. That is, a current flow through the third inductor 630 may be permitted when the first switch 666 is closed (i.e. rendered into a conducting state); a current flow through the third inductor 630 is prevented when the first switch 666 is not opened (i.e. rendered into a non-conducting state). The current flowing through the third inductor 630 builds up a magnetic field in the first transformer 631. When the first switch 666 is opened and the second switch 678 provided in the secondary side circuit 603 is closed thereupon, the magnetic field of the first transformer may induce a voltage across the fifth inductor 632 and a demagnetization current may flow through the fifth inductor 632 provided in the secondary side circuit 603 of the switched mode power supply circuit 600 and may charge the tenth capacitor 670 of the circuit 600 which serves as an output capacitor providing the output voltage. The on-times and the off-times of the second switch 678 may be controlled by the controller 650. A synchronous rectification driver signal may be output at the fifth terminal SRGD of the controller 650 and may be applied to the control terminal of the second switch 678, for example to the gate of the second transistor 678, via the second transformer 699.

The controller 650 may be configured to control the operation of the switched mode power supply circuit 600 in two different ways. The controller 650 may be configured to control the synchronous rectification process in the discontinuous current mode and in the quasi-resonant operation mode of the switched mode power supply circuit 600 according to various embodiments. The controller 650 may be arranged on the primary side circuit 601, as shown in FIG. 6.

The first control method may be a predictive method and it may rely on the volt-second balance theorem which, in general terms, states that the voltage of an inductor is zero during a switching period in steady state. This means that the product of a charge voltage and a charge time, during which the charge voltage is provided to the inductor, is equal to the product of a discharge voltage and discharge time (multiplied with the ratio between the number of windings of the involved coil on the primary side circuit and the number of windings of the coil on the secondary side circuit), during which the discharge voltage is induced by the inductor. In the switched mode power supply circuit 600 based on the flyback converter topology the charge voltage may be applied to the third inductor 630 in the form of the input voltage $V_{in}$. The discharge voltage may correspond to the output voltage $V_{out}$. The input voltage and the output voltage $V_{out}$ may be sensed or detected via an auxiliary (detection) inductor, for example the fourth inductor 634. The zero crossing detection voltage circuit 6122 of the controller 650 may be configured to detect zero crossings of the voltage (or the corresponding current) sensed across the fourth inductor 634. The auxiliary inductor may be included in the transformer 631 and apart from being magnetically coupled to the third inductor 630 it may be also magnetically coupled to the second side of the transformer 631, for example the fifth inductor 632. The information about the input voltage $V_{in}$ and the output voltage $V_{out}$ may be gathered by sampling the voltage across the auxiliary detection inductor 634 in appropriate time intervals. However, that information may be also gathered in an continuous manner. The zero crossing detection and voltage measurement circuit 6122 may evaluate the voltage readings and thereby obtain information about the input voltage $V_{in}$ and the output voltage $V_{out}$ of the circuit 600. The zero crossing detection and voltage measurement circuit 6122 may be configured to detect zero crossings of the voltage sensed across the fourth inductor 634. The controller 650 may be further configured to track the signal output at its third terminal GD to determine the on-time $T_{OnPrim}$ of the first switch 666. In addition, the ratio n, which is a fixed parameter, between the number of windings $N_P$ of the coil on the first side of the first transformer 631 and the number of windings $N_{Sek}$ of the coil on the second side of the first transformer 631 is known to the synchronous rectification predictive calculation circuit 6130. It is to be noted that since the auxiliary detection inductor, i.e. the fourth inductor 634, is used by the controller 6502 sample both the input voltage and the output voltage of the switched mode power supply circuit 600, the number of windings $N_P$ of the coil on the first side of the transformer corresponds to the number of windings $N_{AUX}$ of the auxiliary detection coil, i.e. the fourth inductor 634. The number of windings $N_{Sek}$ of the coil on the second side of the first transformer 631 corresponds to the number of windings of the fifth inductor 632. Eventually, the controller 650 has knowledge of all the parameters needed in order to calculate or predict the on-time $T_{OnSR}$ of the second switch 678 provided in the secondary side circuit 603 according to the formula $$T_{OnSR} = \frac{T_{OnPrim}}{n} \cdot \frac{V_{in}}{V_{out}},$$

such that synchronous rectification may be effectively performed.

The control method just described may be referred to as a predictive control method as it relies on several parameters (i.e. the input voltage $V_{in}$, the output voltage $V_{out}$, the on-time $T_{OnPrim}$ of the first switch 666 and the ratio of turns n of the first transformer 631) which need to be known/measured in order to calculate or predict the on-time $T_{OnSR}$ the second switch 678. The prediction or calculation is based on the volt-second balance theorem. In other words, the controller 650 may be configured to predict or calculate the on-time of the second switch 678 for every cycle based on the measured input voltage $V_{IN}$, the measured output voltage and the measured on-time $T_{OnPrim}$ of the first switch 666.

From the above explanation of the predictive control method it may be followed that the accuracy of the predicted/calculated on-time $T_{OnSR}$ of the second switch 678 may depend on the accuracy of the measurements of the input voltage $V_{in}$ and the output voltage $V_{out}$. The accuracy with which those voltages may be determined is also affected by tolerances of the application. For example, tolerances of resistive voltage dividers and the tolerance of the ratio of turns n of the first transformer 631, which is subject to a scattering range during manufacturing, may cause the voltage measurements to be less accurate.

In order to provide a solution to this problem, the controller 650 may be further configured to provide an adaptive control method for the switched mode power supply circuit 600. The adaptive control method may include a process of determining a demagnetization zero current time of the first transformer 631, at which the first transformer 631 is substantially demagnetized, i.e. the time at which there is no current flow through the secondary side of the first transformer 631, i.e. the fifth inductor 632. The demagnetization zero current time may be determined in any switching cycle of the SMPS circuit 600 according to various embodiments after the first switch 666 provided in the primary side circuit 601 has been switched off. The determined demagnetization zero current time may be used as a reference value for setting the on-time $T_{OnSR}$ of the synchronous power switch provided in the secondary side circuit 603, i.e. the second switch 678, in the next switching cycle. The adaptive control method may have the advantage that the regulating process directly refers to the measured parameter. In other words, the parameter to be regulated by the adaptive control method is the directly measured parameter itself which is neither obtained by combining other possibly inaccurate parameters nor does it contribute to a further parameter which is eventually to be regulated. The demagnetization zero current time of the first transformer 631 determined in a previous switching cycle may be taken as basis for the regulation/setting of the on-time $T_{OnSR}$ of the second switch 678 in a following switching cycle. Therefore, the influence of tolerances of the application on the correct/accurate setting of the parameter to be regulated, in this case the on-time $T_{OnSR}$ of the second switch 678 providing synchronous rectification, may be neglected. The adaptive control method may be based on a primary circuit side regulation of the switched mode power supply circuit 600 according to various embodiments, at the same time providing a primary circuit side regulation of the synchronous rectification process in the discontinuous current mode and the quasi-resonant operation mode of the switched mode power supply circuit 600 according to various embodiments. It is to be mentioned that the switched mode power supply circuit 600 may also operate in the continuous current mode, in which a matched switching of the first transistor 666 and the second transistor 678 may occur, governed by the volt-second balance theorem.

In the following the operation of the controller 650 according to various embodiments will be described in more detail on the basis of diagrams shown in FIGS. 7A to 7D with the focus on the adaptive control method.

In FIGS. 7A to 7D various signal sequences representing voltages and currents are shown in respective diagrams. All four diagrams share a common x-axis 702 which denotes time. In FIG. 7A the diagram 700 shows a detection voltage 706 which may be detected or sensed at the second terminal ZCD of the controller 650 and corresponds to the voltage of the fourth inductor 634 in FIG. 6. Hence the y-axis 704 in diagram 700 denotes the amplitude of the detection voltage 706. In FIG. 7B the diagram 720 shows a first transformer current 726 including a primary side transformer current 724 which may correspond to a current through the third inductor 630 arranged on the primary side 601 of the switched mode power supply circuit 600 and a secondary side transformer current 722 which may correspond to a current through the fifth inductor 632 arranged on the secondary side 603 of the switched mode power supply circuit 600. Hence the y-axis 704 in diagram 720 denotes a current. In diagram 740 of FIG. 7C a driver signal 746 provided by the controller 650 at its third terminal GD is shown which may correspond to a gate driver signal applied to the gate of the first transistor 666 arranged on the primary circuit side 601 of the circuit 600 in FIG. 6. Hence the y-axis 704 in FIG. 7C denotes the amplitude of the driver signal 746 which may assume a low value or a high value, depending on whether the first transistor 666 is to be switched on (rendered into a conducting state) or switched off (rendered into a non-conducting state). In diagram 760 in FIG. 7D a synchronous rectification driver signal 760 corresponding to or derived from the signal provided by the controller 650 at its fifth terminal SRGD is shown. The synchronous rectification driver signal 760 may be applied to the control terminal of the second switch 678, for example the gate of the second transistor 678, arranged on the secondary circuit side 603 of the circuit 600 according to various embodiments shown in FIG. 6. Hence the y-axis 704 in FIG. 7D denotes the amplitude of the driver signal for the second switch 678 which may, in analogy to the driver signal 746 shown in diagram 740 of FIG. 7C assume a low value or a high value, depending on whether the second switch 678 is to be closed (activated) or opened (deactivated).

At a first time t1 the driver signal 746 applied to the control terminal of the first switch 666 is switched to a high value, activating the first switch 666 such that an electrical path from the first input 602 of the converter circuit 600 via the third inductor 630 to the reference potential, e.g. the ground potential, is provided. A steadily rising primary side transformer current 724 ($I_{Prim}$) through the third inductor 630 begins to flow at a first time t1 through the third inductor 630 of the first transformer 631. It is to be noted that the effect of the driver signal 746 on the first switch 666 depends on the choice of the switch. In this exemplary scenario, where the first switch 666 may be configured as an enrichment MOSFET transistor, a high potential applied to its gate renders the first transistor 666 into a conducting state. However, the first switch 666 may be just as well configured as a depletion MOSFET transistor such that the kind of potential necessary to switch on and switch off the first transistor 666 may be adjusted correspondingly. The first switch 666 may remain in the conducting state until a second time t2. As shown in diagram 740 of FIG. 7C, a PWM pulse 742 having a width of $T_{OnPrim}$ corresponding to the on-time of the first switch 666 is applied to the gate of the first switch 666 from the first time t1 until the second time t2. As the auxiliary detection inductor, i.e. the fourth inductor 634 in FIG. 6, is magnetically coupled to the third inductor 630, a voltage is induced in the auxiliary detection inductor 634 and sensed at the second terminal ZCD of the controller 650. The sense of winding of the third inductor 630 is opposite to the sense of winding of the auxiliary detection inductor 634, therefore a positive input voltage $V_{in}$ applied to the third inductor 630 induces a negative voltage across the auxiliary detection inductor 634, its value corresponding to the input voltage multiplied with the number of windings $N_{AUX}$ of the auxiliary detection inductor 634 divided by the number of windings $N_{Sek}$ of the fifth inductor 632. For the time $T_{OnPrim}$ during which the first switch 666 remains switched on, the detection voltage 706 across the auxiliary detection inductor 634 remains at a constant negative value and the primary side transformer current 724 through the third inductor 630 continues to grow linearly. During the on-time $T_{OnPrim}$ of the first transistor 666, the input voltage may be sampled by the zero crossing detection and voltage measurement circuit 6122 at a first sample time $t_{S1}$, for example. During the on-time $T_{OnPrim}$ of the first transistor 666, the transistor 678 on the secondary circuit side of the circuit 600 is in a non-conducting state and the corresponding synchronous rectification driver signal 768 may remain at its low value, for example at zero. The same as said above with respect to the effect of the driver signal 742 on the first transistor 666 also applies to the effect of the synchronous rectification driver signal 768 on the second transistor 678. At the second time t2, the PWM pulse 742 driving the first transistor 666 may be terminated and the driver signal 742 may return to its low value, for example to zero. Upon switching off of the first transistor 666, the current flow through the third inductor 630 is interrupted. The second transistor 678 may be then switched on by a corresponding value of the synchronous rectification driver signal 768, for example a high signal level thereof, and a demagnetization current 722 ($I_{Sec}$) may flow through the fifth inductor 632 and may for example charge the tenth capacitor 670. As shown in diagram 760 in FIG. 7D, the second transistor 678 may remain switched on until a third time t3, such that the time span $T_{OnSR}$ between the second time t2 and the third time t3 corresponds to the on-time of the second transistor 678 or, in other words, the synchronous rectification time during which the second transistor 678 is in a conducting state. During that time, the demagnetization current $I_{Sec}$ (secondary side transformer current 722 induced in the fifth inductor 632) declines steadily as can be seen in diagram 720 of FIG. 7B. The secondary side transformer current 722 induces a voltage across the auxiliary detection inductor 634, the value of which corresponds to the output voltage $V_{out}$ provided at the first output 672 and the second output 674 of the SMPS circuit 600 according to various embodiments, multiplied with the ratio between the number of windings $N_{AUX}$ of the auxiliary detection inductor 634 and the number of windings $N_{Sek}$ of the fifth inductor 632. The second switch 678 may be switched off at the time t3 even though the first transformer 631 does not reach a state of being demagnetized until a fourth time t4. The fourth time t4 may be seen to correspond to the demagnetization zero current time as at that time, as can be seen in diagram 720 in FIG. 7B, the demagnetization current flowing through the inductor on the secondary side of the first transformer 631, i.e. the fifth inductor 632, drops to zero due to the first transformer 631 being demagnetized.

The time span between the third time t3 and the fourth time t4 corresponds to a security time margin $T_{SM}$. In an ideal case, the second transistor 678 would be switched off at the time when the demagnetization current on the secondary circuit side 603 reaches zero, i.e. at the fourth time t4 which corresponds to the demagnetization zero current time. However, due to tolerances of the used components and possible error margins, the second transistor 678 may be switched off before the first transformer 631 is completely demagnetized and the demagnetization current 722 reaches its zero value. Such an earlier switching off of the second transistor 678 may prevent situations in which the tenth capacitor 670, which serves as an energy storage providing the output voltage $V_{out}$ to an output load which may be connected to the first output 672 and the second output 674 of the circuit 600, is discharged via the fifth inductor 632 and the second transistor 678 to ground. Such a discharge current directly translates into a power loss as the tenth capacitor 670 is unnecessarily discharged. A discharge of the tenth capacitor 670 will take place whenever the second transistor 678 remains switched on after the first transformer 631 is fully demagnetized. Therefore, to avoid those unfavourable effects, the second transistor 678 may be switched off prior to the third time t4 by an amount of time equal to the security time margin $T_{SM}$.

Between the third time t3 and the fourth time t4 the demagnetization current 722 ($I_{Sec}$) continues to drop linearly until the fourth time t4, where it reaches zero. During that time, when the second transistor 678 is already switched off but the first transformer 631 is not yet demagnetized. During that time the demagnetization current may be carried by the body diode of the second transistor 678 and/or by the fifth diode 681.

During a normal operation of the SMPS circuit 600 according to various embodiments, the first transistor 666 may be switched on after the second transistor 678 has been switched off, such that a new cycle may begin of storing energy in the magnetic field of the third inductor 630 and then transferring that energy via the fifth inductor 632 to the capacitor 670. The first transistor 666 may in principle be switched back on at the third time t3, for example, or any later time than that. Different operation modes of the SMPS may be realized, depending on when the second transistor 678 is actually switched on.

If the second transistor 678 is switched back on at the third time t3, the secondary side transformer current 722 will practically never be zero (or technically be zero for a negligible amount of time or only at a point in time). In this case, the SMPS circuit 600 would operate in the continuous current mode.

If, on the other hand, the second transistor 678 is switched on at any time later than the third time t3, the secondary side transformer current 722 will remain at zero or even drop below zero (depending on whether a discharge path for the charges stored in the tenth capacitor 670 is provided or not, for example via a diode) and hence the SMPS circuit 600 will operate in the discontinuous current mode.

In diagram 700 in FIG. 7A it can be seen that the detection voltage 706 starts oscillating at the fourth time t4. At that time the first transistor 666 on the primary side 601 of the SMPS circuit 600 remains switched off. The oscillation is caused by parasitic capacitances, for example the source-drain capacitance of the first transistor 666 and/or the source-drain capacitance of the second transistor 678 and/or parasitic capacitances of the transformer 632. An oscillation period $T_{OSC}$ of that oscillation will be determined by the system parameters and will also encompass the mentioned parasitic capacitances and parasitic inductances inherent in the system.

The aim of the adaptive control method is to provide an optimal timing for the switching off of the second transistor 687. Here it is assumed that the second transistor 678 is to be switched off at the fourth time t4, i.e. at the magnetization zero current time. Therefore, the magnetization zero current time needs to be determined as accurately as possible. This may be performed in the way which will be described in more detail below.

In a first step, the controller 650 may be configured to determine/measure a measured time period $T_{Mes}$. The measurement of that time period may be triggered by a falling edge of the driving signal 746 output by the controller 650 at its third terminal GD. In other words, the beginning of the measured time period $T_{Mes}$ may coincide with the switching off of the first transistor 666. The measurement of the measured time period $T_{Mes}$ may be finished when the zero crossing detection and voltage measurement circuit 6122 detects a zero crossing of the detection voltage 706 across the fourth inductor 634, in this exemplary scenario the first zero crossing of the detection voltage 706. The first zero crossing of the detection voltage occurs at a fifth time t5, one quarter of the oscillation period $T_{OSC/4}$ later than the actual zero magnetization current time t4. It takes one quarter of the oscillation period $T_{OSC/4}$ for the detection voltage 706 to "swing down" from its value at the fourth time t4 to zero at the fifth time t5. Therefore, the demagnetization time period $T_{Sec}$ may be obtained from the measured time period $T_{Mes}$ by subtracting therefrom one quarter of the oscillation period $T_{OSC/4}$. The demagnetization time period $T_{Sec}$ corresponds to the time interval during which the secondary side current 722 drops to zero from its initial non-zero value at the time when first switch 666 is switched off. The oscillation period $T_{OSC}$ is independent of the load connected to the SMPS circuit 600 according to various embodiments. Furthermore, the oscillation period $T_{OSC}$ takes into account component tolerances and parasitic contributions of the overall system which may affect the oscillation period $T_{OSC}$. The oscillation period $T_{OSC}$ may be determined in a switching cycle during an initial start up phase of the SMPS circuit 600 according to various embodiments by determining the time difference between any two zero crossings of the detection voltage 706 (e.g. a first 708 and a third 712 zero crossing may be evaluated to determine the oscillation period $T_{OSC}$ or a first 708 and a second 710 zero crossing may be evaluated to determine one half of the oscillation period $T_{OSC}$).

Once the demagnetization time period $T_{Sec}$ has been determined, for example by the time measurement circuit 6126 of the controller 650, it may be provided to the adaptive synchronous rectification control circuit 6130. In principle, the on-time $T_{OnSR}$ of the second transistor 678 may be set equal to the demagnetization time period $T_{Sec}$. However, as explained above, the security margin time period $T_{SM}$ may need to be considered such that the adaptive synchronous rectification control circuit 6130 may be configured to subtract the security margin time period $T_{SM}$ from the determined demagnetization time period $T_{Sec}$. Thus, the resulting adaptively determined time period $T_{OnSR}$ may correspond to the actual on-time of the second transistor 678, $$T_{OnSR} = T_{Mes} - T_{OSC/4} - T_{SM}.$$

The synchronous rectification driver circuit 6128 may be configured to adjust the duty cycle of the synchronous rectification driver signal 768 accordingly and apply that adjusted synchronous rectification driver signal 768 to the gate terminal of the second transistor 678.

With the adaptive control method just described it is possible to adjust the on-time of the second transistor 678 in a switching cycle based on the demagnetization time period $T_{Sec}$ determined in the previous switching cycle of the SMPS circuit 600 according to various embodiments. According to various embodiments, a switching cycle of the SMPS circuit 600 may refer to the time interval beginning with the first switch 666 being switched on and ending with the first switch 666 being switched on again after the second switch has been switched on and off. The security time margin $T_{SM}$ may be an adjustable parameter which may be adjusted in accordance with a changing working environment of the corresponding SMPS application, wherein the working environment may encompass the input voltage $V_{in}$, the output voltage $V_{out}$, the load coupled to the SMPS application, the frequency of the PWM driving signal for the first transistor 666 and the second transistor 678, for example.

When the SMPS circuit 600 according to various embodiments is powered on for the first time, the previously described predictive control method may be used to determine an initial on-time $T_{OnSR}$ of the second switch 678. Alternatively, a default on-time $T_{OnSR}$ may be defined or a default on-time $T_{OnSR}$ may be chosen from a multitude of on-times $T_{OnSR}$, depending on initial conditions of the SMPS circuit 600 such as the magnitude of the input voltage $V_{in}$ and/or output voltage $V_{out}$ and/or the magnitude of the load coupled thereto. Beginning with the next switching cycle, the on-time $T_{OnSR}$ of the second switch 678 may be adapted in the way just described to obtain an optimal switching of the second transistor 678.

As long as the second switch 678 is switched off before the demagnetization zero current time t4, the measured time period $T_{Mes}$ will not change since the magnetic field of the first transformer 631 is built up during the on-time $T_{OnPrim}$ of the first transistor 666 and the amount of energy stored in the first transformer 631 in the form of the magnetic field defines the demagnetization time period $T_{Sec}$, i.e. the time it takes for the magnetic field to decay to zero. This assumption is valid if a steady state of the SMPS circuit 600 is assumed, i.e. a state in which the load remains unchanged. If, however, the second transistor 678 is switched off too late, i.e. at any time later than the demagnetization zero current time t4, the measured time period $T_{Mes}$ will become larger. Therefore, the measured time period $T_{Mes}$ measured in any switching cycle may be compared to the measured time period $T_{Mes}$ of the last switching cycle. If no increase of the measured time period $T_{Mes}$ is detected, the security margin $T_{SM}$ may be decreased in order to move the actual switching off time (in this example the third time t3) of the second transistor 678 closer to the theoretically optimal switching off time represented by the fourth time t4. A larger measured time period $T_{Mes}$ in comparison to the measured time period $T_{Mes}$ in a preceding switching cycle indicates that the second switch 678 has been switched off at a time past the fourth time t4, i.e. past the magnetization zero current time. In such a case power is lost since the capacitor 670 is discharged via the switched on second switch 678. In such a situation the on-time $T_{OnSR}$ may be reduced for the next switching cycle by increasing the security margin $T_{SM}$. The security margin $T_{SM}$ may then be increased to a standard default value or it may be multiplied by a predefined factor or it may be set back to the last working security margin $T_{SM}$ or it may be increased in any other suitable way. One of the aspects of the adaptive control method may be an iterative stepwise approximation process of the security margin $T_{SM}$ while a condition is checked. As soon as the condition is fulfilled (i.e. as soon as an increase of the measured time period $T_{Mes}$ is detected), the approximation process is terminated and the security margin $T_{SM}$ is reset to a larger, in a sense more secure, value. In summary it may be said that the adaptive control method during steady state operation of the SMPS circuit 600 according to various embodiments may be based on an cycle by cycle stepwise adjusting of the security margin $T_{SM}$.

Figure 10:
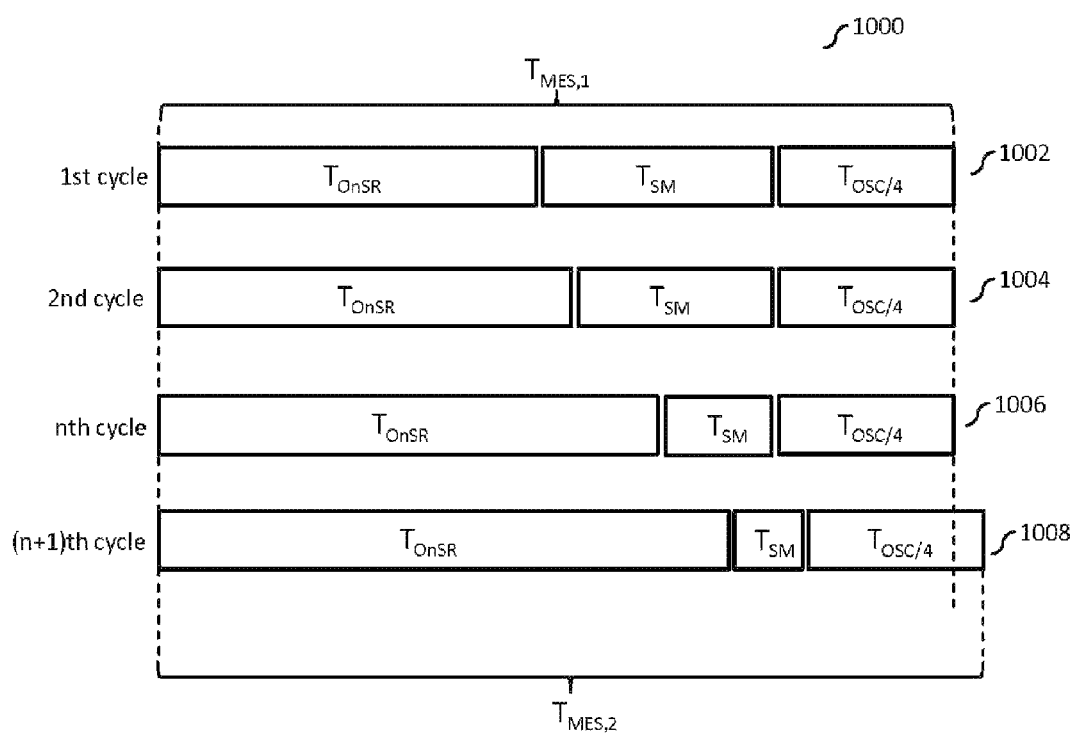
FIG. 10 shows a diagram describing the adaptive control method for adjusting the on-time of the power switch on the second side of the switched mode power supply circuit according to various embodiments.

The procedure just described is summarized in FIG. 10 for the case of a constant load. In diagram 1000 in FIG. 10 a composition of the measured time period $T_{Mes}$ in each of the respective switching cycles in an exemplary sequence of switching cycles of the SMPS converter according to various embodiments is shown. Each measured time period $T_{Mes}$ is comprised of the on-time $T_{OnSR}$ of the second transistor 678 to be determined, the measured one quarter of the oscillation period $T_{OSC/4}$ and the security time margin $T_{SM}$. The widths of the rectangles representing the three time periods contributing to the measured time $T_{SM}$ are not to be seen as reflecting the actual ratios between those time periods, the diagram 1000 shown in FIG. 10 rather shows qualitative aspects of the adaptation procedure.

The 1st switching cycle 1002 may be any switching cycle during the operation of the SMPS circuit according to various embodiments chosen to the "starting" switching cycle defining the initial condition for the following analysis. If the 1st switching cycle 1002 is indeed the very first switching cycle of the SMPS circuit after it has been powered on, the security time margin $T_{SM}$ may, for example, correspond to a certain percentage of the on-time $T_{OnSR}$ of the second transistor 678 which may be determined by the predictive control method already described earlier. Alternatively, the security time margin $T_{SM}$ may assume a default value which may or may not be further adjusted (e.g. chosen from a list of several default values which may be chosen depending on initial and/or working conditions) to the working conditions of the SMPS circuit at the moment when it is powered on.

As can be seen in the diagram 1000 in FIG. 10, the contribution to the measured time period $T_{Mes,1}$ from the oscillation time period $T_{OSC/4}$ remains constant between the 1st switching cycle 1002 nth switching cycle 1006. Therefore, the security time margin $T_{SM}$ may be successively reduced such that the on-time $T_{OnSR}$ of the second transistor 678 may successively approach its optimum value corresponding to the demagnetization time period $T_{Sec}$. The successive decreasing of the security time margin $T_{SM}$ may last several switching cycles. At every switching cycle a condition is checked, whether the measured time period $T_{Mes}$ has increased with respect to the measured time period $T_{Mes}$ in preceding switching cycle. However, a moving average of the preceding two, three, four or five or more switching cycles may be considered as the basis for the comparison. As can be seen in diagram 1000 in FIG. 10, the condition is not fulfilled from the 1st switching cycle 1002 to the 2nd switching cycle 1004 and it is not fulfilled up to the nth switching cycle 1006 either. In other words, the security time margin $T_{SM}$ has been successively reduced beginning with the 2nd switching cycle up to the nth switching cycle without the measured time period $T_{Mes}$ increasing. This means that the second transistor 678, in every switching cycle up to the nth switching cycle 1006, is still switched off prior to the demagnetization zero current time (see fourth time t4 in FIG. 7B). Therefore, the security time margin $T_{SM}$ is further decreased transitioning from the nth switching cycle 1006 to the (n+1)th switching cycle 1008. However, in the (n+1)th switching cycle 1008 a longer measured time period $T_{Mes,2}$ is measured compared with the previous measured time period $T_{Mes,1}$. Therefore, in the (n+1)th switching cycle 1008 the condition is fulfilled, indicating that the on-time $T_{OnSR}$ of the second switch 678 is too long, i.e. that the second switch is switched off past the magnetization zero current time. Therefore, the security time margin $T_{SM}$ is not further increased. Instead, the security time margin $T_{SM}$ may be decreased, for example to a predetermined default value or to its value from the last switching cycle where the condition was not fulfilled. The reduction of the security time margin $T_{SM}$, when the condition is fulfilled, aims at reducing the on-time $T_{OnSR}$ of the second transistor 678 such that it is switched off before the first transformer 631 reaches the state of being demagnetized.

The adaptive procedure just described on the basis of FIG. 10 may be also altered in the sense that the optimum value of the security margin time $T_{SM}$ is approximated by successively increasing the security margin time $T_{SM}$ starting from zero. In that alternative embodiment of the adaptive procedure, assuming that the on-time $T_{OnSR}$ is too large, the measured time period $T_{Mes}$ will decrease from one switching cycle to the next switching cycle and once the on-time $T_{OnSR}$ of the second transistor 768 has been reduced below the value of the demagnetization time period $T_{Sec}$, the measured time period $T_{Mes}$ will remain constant and the approximation procedure may terminate.

The security margin $T_{SM}$ may also play a crucial role in the adaptive control method during load change, i.e. in non-steady state conditions of the SMPS circuit 600 according to various embodiments. In principle, increasing loads and decreasing loads including, in the latter case, the extreme case of a decoupling of a load from the corresponding SMPS application (load throw-off) have to be dealt with. The adaptive synchronous rectification control circuit 6130 may obtain information regarding the kind of load change (increasing or decreasing) from the state of a proportional-integral filter (PI-filter) provided in the flyback peak current mode control circuit 6124 and use this information to adjust the security margin $T_{SM}$ correspondingly during the settling time of the output voltage $V_{out}$ after a load change.

An increase of load causes the demagnetization time period $T_{Sec}$ to increase in the settled state (steady-state). In reaction thereto, the security time margin $T_{SM}$ may be set to a larger value, triggered by the PI-regulator provided in the flyback peak current mode control circuit 6124. After the PI-regulator has settled, the security time margin $T_{SM}$ may be iteratively adjusted to reach the smallest possible value in the manner described above. Seen from the point of view of the PWM driving signal this situation corresponds to an adaptive increase of the on-time $T_{OnSR}$ of the synchronous power switch (the second transistor 678).

A decrease of load causes the demagnetization time period $T_{Sec}$ to decrease in the settled state (steady-state). In reaction thereto, the security margin $T_{SM}$ may be set to a larger value, triggered by the PI-regulator provided in the flyback peak current mode control circuit 6124. Since a complete throw-off of load has to be considered as a possible scenario, the on-time $T_{OnSR}$ of the second transistor 678 may be set to approximately 0 during the first switching cycles after the throw-off of load, until the PI-regulator has settled in a predefined target region. After the PI-regulator has settled and its output signal has reached its steady state value, the on-time $T_{OnSR}$ of the second transistor 678 for the next switching cycle may be determined by determining the demagnetization time period $T_{Sec}$ from the measurement of the measured time period $T_{Mes}$, as described above.

Instead of using the output signal of the PI-regulator provided in the flyback peak current mode control circuit 6124, the input signal of the PI-regulator may be used to determine whether the load coupled to the output of the switched mode power supply circuit 600 according to various embodiments is increasing or decreasing. Furthermore, by monitoring the output voltage Vout the state of the load coupled to the output of the switched mode power supply circuit 600 according to various embodiments may be determined, wherein an output voltage Vout dropping below a preset output voltage value may indicate an increasing load and wherein an output voltage Vout rising above the preset output voltage value may indicate an decreasing load.

Independent of the kind of load change, i.e. an increase of load or a decrease of load, after the security time margin $T_{SM}$ has been increased to a larger value, the security time margin $T_{SM}$ may be successively decreased to approximate its optimal value by applying the adaptive process described in FIG. 10.

In order to minimize switching losses, the first transistor 666 may be switched on at zero crossings of the detection voltage 706 in a running SMPS application. A zero crossing of the detection voltage 706 may be easily detected by the zero crossing detection and voltage measurement circuit 6122. Switching the first transistor 666 back on at the first zero crossing 708, the second zero crossing 710 or the third zero crossing 712 (or any further zero crossing in the oscillating part of the detection voltage 706) will result in the so-called quasi-resonant operation of the SMPS circuit 600 according to various embodiments. The quasi-resonant operation mode may be seen as a special case of the discontinuous current mode.

Triggering the switching on of the first switch 666 on the primary side of the SMPS circuit 600 by zero crossings (instead of the demagnetization zero current time) may be for example used in low load conditions. With low loads connected to the SMPS circuit 600 according to various embodiments, the on-time $T_{OnPrim}$ of the first transistor 666 will become shorter as only little energy is required, consequently leading to shorter demagnetization time periods $T_{Sec}$ required for the secondary side transformer current $I_{Sec}$ to reach zero. Speaking figuratively, the triangle in diagram 720 in FIG. 7A would become smaller, having a shorter base. This would lead to a faster frequency of the PWM signal provided to the switches in the SMPS circuit 600 according to various embodiments. By triggering the switching on of the first transistor 666 on the first zero crossing point 708, the second zero crossing point 710, the third zero crossing point 712 or any further zero crossing point, an increase of the frequency of the PWM signal may be effectively prevented, while the first transistor 666 is being selectively switched on at times when the voltage applied to it is zero, hence minimizing switching losses.

In accordance with various further embodiments, the switched mode power supply circuit 600 may be also operated in reverse, i.e. an input AC voltage may be applied to its first output 672 and its second output 674 and it may be transformed into an output DC output voltage which may be provided at its first input 602 and its second input 604. In the case of the power supply circuit 600 according to various embodiments being operated in reverse, it may be used to convert a lower input voltage into a higher DC output voltage. Then, the role of the first transistor 666 and the second transistor 678 would be inverted. That is, the on-time 764 of the second transistor 678 (corresponding to the synchronous rectification time $T_{OnSR}$) would be determined or preset by the controller 650 and the controller 650 could then calculate or predict the on-time $T_{OnPrim}$ of the first transistor 666 accordingly. As in the previously described forward operation mode of the switched mode power supply circuit 600 according to various embodiments the required information about the input voltage $V_{in}$ and the output voltage $V_{out}$ may be obtained by the means of the fourth inductor 634 which, together with the zero crossing detection and voltage measurement circuit 6122 via the second terminal ZCD of the controller 650, is so to speak "monitoring" the voltage across or the current through any of the other inductors included in the first transformer 631.

Figure 8:
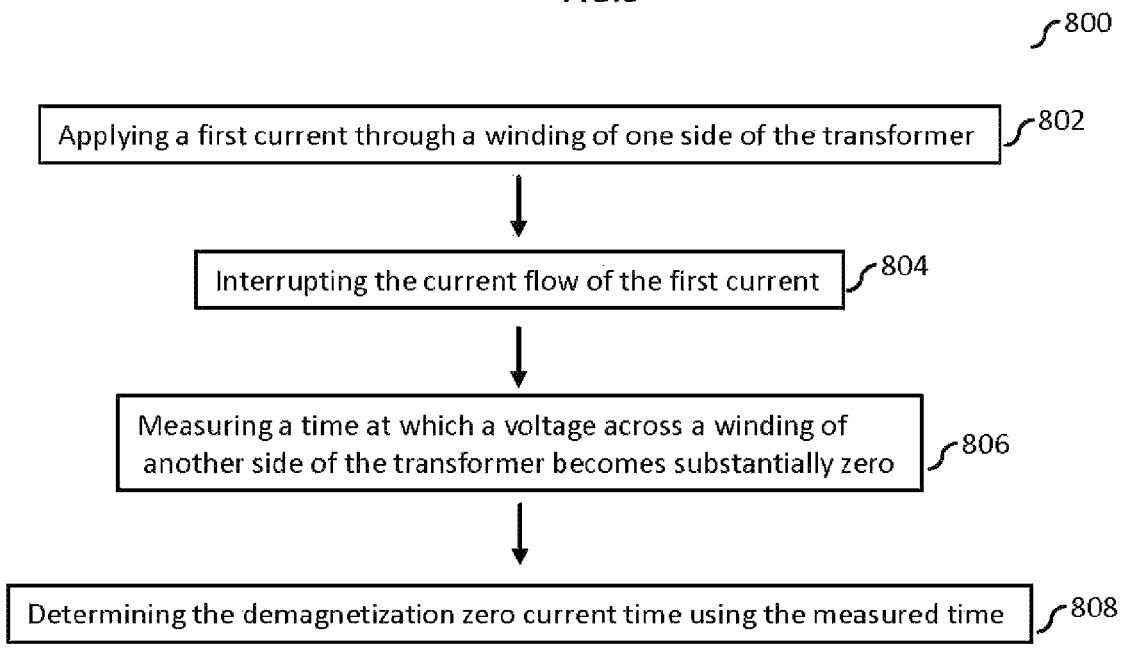
FIG. 8 shows a flow diagram illustrating a method for determining a demagnetization zero current time for a switched mode power supply according to various embodiments.

In FIG. 8, a flow diagram 800 describing the adaptive control method according to various embodiments which may be implemented by means of the controller 650 of the switched mode power supply circuit 600 is shown. The adaptive control method may be a method for determining a demagnetization zero current time, at which a transformer is substantially demagnetized, for a switched mode power supply comprising a transformer.

In a first step 802 of the method according to various embodiments, a first current may be applied through a winding of one side of the transformer.

In a next step 804, the first current flow may be interrupted. This may be achieved by opening a switch, for example a transistor, in a circuit coupled to the one side of the transformer.

In a next step 806 a time at which a voltage across a winding of another side of the transformer becomes substantially zero may be measured.

In a next step the demagnetization zero current time may be determined using the measured time.

Figure 9:
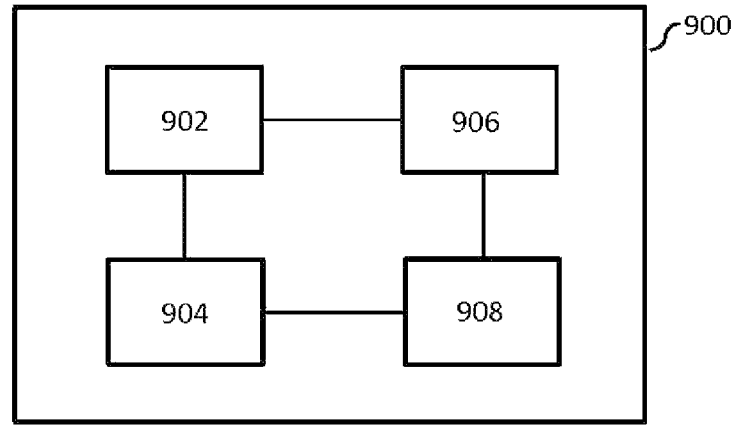
FIG. 9 shows a circuit arrangement for determining a demagnetization zero current time for a switched mode power supply according to various embodiments.

In FIG. 9 a circuit arrangement 900 for determining a demagnetization zero current time, at which a transformer is substantially demagnetized, is shown. The circuit arrangement 900 may be used in combination with a switched mode power supply including a transformer and a first side and a second side being galvanically separated from each other.

The circuit arrangement 900 may include a current supply 902 configured to apply a first current through a winding of one side of the transformer. The current supply 902 may therefore be coupled to the winding the one side of the transformer. The circuit arrangement 900 may further include a control circuit 904 configured to interrupt the current flow of the first current. The current flow of the first current may be for example interrupted by switching off a switch which may be provided in the circuit coupled to the one side of the transformer. The circuit arrangement 900 may further include a measuring circuit 906 configured to measure a time at which a voltage across a winding of another side of the transformer becomes substantially zero. The circuit arrangement 900 may further include a determining circuit 908 configured to determine the demagnetization zero current time using the measured time. The various circuits just listed may be connected to each other by corresponding electrical connections such that they may all communicate with each other.

In accordance with various embodiments a method for determining a demagnetization zero current time, at which a transformer is substantially demagnetized, for a switched mode power supply comprising a transformer is provided, wherein the method may include: applying a first current through a winding of one side of the transformer; interrupting the current flow of the first current; measuring a time at which a voltage across a winding of another side of the transformer becomes substantially zero; and determining the demagnetization zero current time using the measured time.

According to further embodiments, the method may further include repeating the method a plurality of times, wherein the demagnetization zero current time may be respectively determined using the time, at which the respective voltage across the winding of the other side of the transformer becomes substantially zero.

According to further embodiments, the method may further include allowing a second current to flow through the winding of the other side of the transformer for a predetermined time period.

According to further embodiments, the method may further include determining whether the measured time fulfils a predefined criterion; and in case the measured time does not fulfil the predefined criterion, allowing the second current to flow through the winding of the other side of the transformer for the predetermined time period.

According to further embodiments of the method, interrupting the current flow of the first current may include switching on a switch coupled between the transformer and an output of the switched mode power supply.

According to further embodiments of the method, the time at which the voltage across the winding of the other side of the transformer becomes substantially zero may include a bypass time period during which the switch coupled between the transformer and an output of the switched mode power supply is bypassed by a diode.

According to further embodiments of the method, the switch may include a transistor.

According to further embodiments of the method, a further diode may be coupled in parallel to the transistor.

According to further embodiments of the method, the switch may include a metal oxide field effect transistor.

According to further embodiments of the method, the measuring of a time at which the voltage becomes substantially zero may include a process selected from a group of processes consisting of: determining the zero voltage crossing of a transformer winding; determining the minimum voltage crossing of a transformer winding; and determining a voltage of a transformer winding which is smaller than a voltage occurring while a current flows through a winding of the second side of the transformer.

According to further embodiments the method may further include determining a time period during which the first current through the winding of one side of the transformer is applied and the predetermined time period of a further switching cycle using a ratio between a predetermined time period during which the first current through the winding of one side of the transformer is applied of a previous switching cycle and the predetermined time period of a previous switching cycle.

According to further embodiments of the method, the predetermined time period may be determined further taking into account a predetermined security time margin.

According to further embodiments of the method, the predetermined security time margin may be determined dependent on at least one of the following: output voltage of the switched mode power supply; a change of the output voltage of the switched mode power supply; a previous security time margin; an average of a plurality of previous security time margins; one or more system state parameters of the switched mode power supply.

According to further embodiments of the method, the predetermined time period may be determined by subtracting the security time margin from the demagnetization zero current time.

According to further embodiments, the method may further include determining a load change on the other side of the transformer; and determining the demagnetization zero current time dependent on the determined load change.

According to further embodiments of the method, a load increase may cause the predetermined time period to increase.

According to further embodiments of the method, a load decrease causes the predetermined time period to decrease.

According to further embodiments of the method, the switched mode power supply may further include a galvanically isolated transmitter, wherein the galvanically isolated transmitter may transmit a switching signal from the circuit to the other side of the galvanically isolated transmitter.

According to further embodiments of the method, the one side may be the primary side of the transformer; and the other side may be the secondary side of the transformer.

According to further embodiments of the method the one side may be the secondary side of the transformer; and the other side may be the primary side of the transformer.

In accordance with various further embodiments a method for controlling a switched mode power supply comprising a transformer and a first side and a second side being galvanically separated from each other is provided, wherein the method may include determining a demagnetization zero current time for the switched mode power supply, the determining including: applying a first current through a winding of one side of the transformer; interrupting the current flow of the first current; measuring a time at which a voltage across a winding of another side of the transformer becomes substantially zero; determining the demagnetization zero current time using the measured time; and controlling the switched mode power supply in accordance with the determined demagnetization zero current time.

According to various further embodiments of the method, the controlling the switched mode power supply may include a switching off a switch on the second side in accordance with the determined demagnetization zero current time.

According to various further embodiments of the method, the switch on the second side may be controlled such that it is switched off a predefined time before the determined demagnetization zero current time.

In accordance with various further embodiments a circuit arrangement for determining a demagnetization zero current time, at which a transformer is substantially demagnetized, for a switched mode power supply comprising a transformer and a first side and a second side being galvanically separated from each other is provided, wherein the circuit arrangement may include: a current supply configured to apply a first current through a winding of one side of the transformer; a control circuit configured to interrupt the current flow of the first current; a measuring circuit configured to measure a time at which a voltage across a winding of another side of the transformer becomes substantially zero; and a determining circuit configured to determine the demagnetization zero current time using the measured time.

According to various embodiments, the circuit arrangement may further include a switch coupled between the transformer and an output of the switched mode power supply.

According to various embodiments, the circuit arrangement may further include a diode connected in parallel to the switch.

According to various embodiments of the circuit arrangement, the control circuit may be further configured to and to apply a second current through the winding of the other side of the transformer bypassing the diode for a predetermined time period.

According to various embodiments of the circuit arrangement, the measuring circuit may be configured to measure the time at which the second current becomes substantially zero using a process selected from a group of processes consisting of: determining the zero voltage crossing of a transformer winding; determining the minimum voltage crossing of a transformer winding; and determining a voltage of a transformer winding which is smaller than a voltage occurring while a current flows through a winding of the second side of the transformer.

According to various embodiments, the circuit arrangement may further include a further determining circuit configured to determine a time period during which the first current through the winding of one side of the transformer is applied and the predetermined time period of a further switching cycle using a ratio between a predetermined time period during which the first current through the winding of one side of the transformer is applied of a previous switching cycle and the predetermined time period of a previous switching cycle.

According to various embodiments, the circuit arrangement may be configured to determine the predetermined time period further taking into account a predetermined security time margin.

According to various embodiments of the circuit arrangement, the circuit arrangement may be configured to determine the predetermined security time margin dependent on at least one of the following: output voltage of the switched mode power supply; a change of the output voltage of the switched mode power supply; a previous security time margin; an average of a plurality of previous security time margins; one or more system state parameters of the switched mode power supply.

According to various embodiments of the circuit arrangement, the control circuit may be further configured to determine a load change on the second side of the transformer and to determine the demagnetization zero current time dependent on the determined load change.

In accordance with various embodiments a circuit arrangement for controlling a switched mode power supply including a transformer and a first side and a second side being galvanically separated from each other is provided, wherein the circuit arrangement may include a determining circuit configured to determine a demagnetization zero current time, at which the transformer is substantially demagnetized, for the switched mode power supply, the determining circuit including: a current supply configured to apply a first current through a winding of one side of the transformer; a control circuit configured to interrupt the current flow of the first current; a measuring circuit configured to measure a time at which a voltage across a winding of another side of the transformer becomes substantially zero; a determiner circuit configured to determine the demagnetization zero current time using the measured time; and a controller configured to control the switched mode power supply in accordance with the determined demagnetization zero current time.

According to various embodiments of the circuit arrangement, the controller may be further configured to switch off a switch on the second side in accordance with the determined demagnetization zero current time.

According to various embodiments of the circuit arrangement, the controller may be further configured to switch off the switch on the second side a predefined time before the determined demagnetization zero current time.

In accordance with various further embodiments a circuit arrangement is provided, having a switched mode power supply comprising: a transformer and a first side and a second side being galvanically separated from each other; a determining circuit configured to determine a demagnetization zero current time, at which the transformer is substantially demagnetized, for the switched mode power supply, the determining circuit comprising: a current supply configured to apply a first current through a winding of one side of the transformer; a control circuit configured to interrupt the current flow of the first current; a measuring circuit configured to measure a time at which a voltage across a winding of another side of the transformer becomes substantially zero; a determiner circuit configured to determine the demagnetization zero current time using the measured time; and a controller configured to control the switched mode power supply in accordance with the determined demagnetization zero current time.

According to various embodiments of the circuit arrangement, the switched mode power supply may further include a switch coupled between the transformer and an output of the switched mode power supply.

According to various embodiments of the circuit arrangement, the switch may include a transistor.

According to various embodiments of the circuit arrangement, the transistor may include a field effect transistor.

According to various embodiments of the circuit arrangement, the transistor may include a metal oxide semiconductor field effect transistor.

According to various embodiments of the circuit arrangement, the switched mode power supply may further include a diode coupled in parallel to the switch.

According to various embodiments of the circuit arrangement, the switch may include a transistor; and the diode may include a body diode of a transistor.

According to various embodiments of the circuit arrangement, the switched mode power supply may further include a galvanically isolated transmitter, wherein the galvanically isolated transmitter may transmit a switching signal from the circuit to the other side of the galvanically isolated transmitter.

According to various embodiments of the circuit arrangement, the first side may be the primary side of the transformer; and the second side may be the secondary side of the transformer.

According to various embodiments of the circuit arrangement, the first side may be the secondary side of the transformer; and the second side may be the primary side of the transformer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for determining a demagnetization zero current time period, during which a transformer is substantially demagnetized, for a switched mode power supply, comprising a transformer having a first side and a second side, the method comprising:
applying a first current through a winding of the first side of the transformer;
interrupting the current flow of the first current;
measuring a time period triggered by the interruption of the current flow of the first current and finishing at a time at which a voltage across a winding of the second side of the transformer becomes substantially zero;
determining the demagnetization zero current time period using the measured time period.

2. The method of claim 1, further comprising:
repeating the method a plurality of times, wherein the demagnetization zero current time is respectively determined using the time, at which the respective voltage across the winding of the second side of the transformer becomes substantially zero.

3. The method of claim 1, further comprising:
allowing a second current to flow through the winding of the second side of the transformer for a predetermined time period.

4. The method of claim 3, further comprising:
determining whether the measured time period fulfils a predefined criterion; and
in case the measured time period does not fulfil the predefined criterion, allowing the second current to flow through the winding of the second side of the transformer for the predetermined time period.

5. The method of claim 3,
wherein interrupting the current flow of the first current comprises switching on a switch coupled between the transformer and an output of the switched mode power supply.

6. The method of claim 5,
wherein the time at which the voltage across the winding of the second side of the transformer becomes substantially zero comprises a bypass time period during which the switch coupled between the transformer and an output of the switched mode power supply is bypassed by a diode.

7. The method of claim 3, further comprising:
determining a time period during which the first current through the winding of the first side of the transformer is applied and the predetermined time period of a further switching cycle using a ratio between a predetermined time period during which the first current through the winding of the first side of the transformer is applied of a previous switching cycle and the predetermined time period of a previous switching cycle.

8. The method of claim 3,
wherein the predetermined time period is determined further taking into account a predetermined security time margin.

9. The method of claim 8,
wherein the predetermined security time margin is determined dependent on at least one of the following:
output voltage of the switched mode power supply;
a change of the output voltage of the switched mode power supply;
a previous security time margin;
an average of a plurality of previous security time margins;
one or more system state parameters of the switched mode power supply.

10. The method of claim 8,
wherein the predetermined time period is determined by subtracting the security time margin from the demagnetization zero current time.

11. The method of claim 3, further comprising:
determining a load change on the second side of the transformer; and
determining the demagnetization zero current time period dependent on the determined load change.

12. The method of claim 11,
wherein a load increase causes the predetermined time period to increase.

13. The method of claim 11,
wherein a load decrease causes the predetermined time period to decrease.

14. The method of claim 1,
wherein the switched mode power supply further comprises a galvanically isolated transmitter;
wherein the galvanically isolated transmitter transmits a switching signal from the circuit to the second side of the galvanically isolated transmitter.

15. A method for controlling a switched mode power supply comprising a transformer and a first side and a second side being galvanically separated from each other, the method comprising:
determining a demagnetization zero current time period for the switched mode power supply, the determining comprising:
applying a first current through a winding of the first side of the transformer;
interrupting the current flow of the first current;
measuring a time period triggered by the interruption of the current flow of the first current and finishing at a time at which a voltage across a winding of the second side of the transformer becomes substantially zero;
determining the demagnetization zero current time period using the measured time period; and
controlling the switched mode power supply in accordance with the determined demagnetization zero current time period.

16. The method of claim 15,
wherein the controlling the switched mode power supply comprises a switching off a switch on the second side in accordance with the determined demagnetization zero current time.

17. A circuit arrangement for determining a demagnetization zero current time period, during which a transformer is substantially demagnetized, for a switched mode power supply comprising a transformer and a first side and a second side being galvanically separated from each other, the circuit arrangement comprising:
a current supply configured to apply a first current through a winding of the first side of the transformer;
a control circuit configured to interrupt the current flow of the first current;
a measuring circuit configured to measure a time period triggered by the interruption of the current flow of the first current and finishing at a time at which a voltage across a winding of the second side of the transformer becomes substantially zero;
a determining circuit configured to determine the demagnetization zero current time period using the measured time period.

18. The circuit arrangement of claim 17, further comprising:
a switch coupled between the transformer and an output of the switched mode power supply.

19. The circuit arrangement of claim 18, further comprising:
a further determining circuit configured to determine a time period during which the first current through the winding of the first side of the transformer is applied and the predetermined time period of a further switching cycle using a ratio between a predetermined time period during which the first current through the winding of the first side of the transformer is applied of a previous switching cycle and the predetermined time period of a previous switching cycle.

20. The circuit arrangement of claim 17, wherein the control circuit is further configured to determine a load change on the second side of the transformer and to determine the demagnetization zero current time dependent on the determined load change.

21. A circuit arrangement for controlling a switched mode power supply comprising a transformer and a first side and a second side being galvanically separated from each other, the circuit arrangement comprising:
- a determining circuit configured to determine a demagnetization zero current time period, during which the transformer is substantially demagnetized, for the switched mode power supply, the determining circuit comprising:
  - a current supply configured to apply a first current through a winding of the first side of the transformer;
  - a control circuit configured to interrupt the current flow of the first current;
  - a measuring circuit configured to measure a time period triggered by the interruption of the current flow of the first current and finishing at a time at which a voltage across a winding of the second side of the transformer becomes substantially zero;
  - a determiner circuit configured to determine the demagnetization zero current time period using the measured time period; and
- a controller configured to control the switched mode power supply in accordance with the determined demagnetization zero current time period.

22. The circuit arrangement of claim 21, wherein the controller is further configured to switch off a switch on the second side in accordance with the determined demagnetization zero current time.

23. A circuit arrangement, comprising:
- a switched mode power supply comprising:
  - a transformer and a first side and a second side being galvanically separated from each other;
  - a determining circuit configured to determine a demagnetization zero current time period, at during which the transformer is substantially demagnetized, for the switched mode power supply, the determining circuit comprising:
    - a current supply configured to apply a first current through a winding of the first side of the transformer;
    - a control circuit configured to interrupt the current flow of the first current;
    - a measuring circuit configured to measure a time period triggered by the interruption of the current flow of the first current and finishing at a time at which a voltage across a winding of the second side of the transformer becomes substantially zero;
    - a determiner circuit configured to determine the demagnetization zero current time period using the measured time period; and
- a controller configured to control the switched mode power supply in accordance with the determined demagnetization zero current time period.

24. The circuit arrangement of claim 23, wherein the switched mode power supply further comprises:
- a switch coupled between the transformer and an output of the switched mode power supply.

25. The circuit arrangement of claim 23, wherein the switched mode power supply further comprises a galvanically isolated transmitter; wherein the galvanically isolated transmitter transmits a switching signal from a side of the circuit to the another side of the galvanically isolated transmitter.

* * * * *